US010115442B2

(12) United States Patent
Kelly et al.

(10) Patent No.: US 10,115,442 B2
(45) Date of Patent: Oct. 30, 2018

(54) DEMAND-BASED PROVISIONING OF VOLATILE MEMORY FOR USE AS NON-VOLATILE MEMORY

(71) Applicant: Microsoft Technology Licensing, LLC, Redmond, WA (US)

(72) Inventors: Bryan D. Kelly, Carnation, WA (US); Mallik Bulusu, Bellevue, WA (US); Ravi Mysore Shantamurthy, Redmond, WA (US); Tom L. Nguyen, Auburn, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 116 days.

(21) Appl. No.: 15/252,070

(22) Filed: Aug. 30, 2016

(65) Prior Publication Data

US 2017/0212687 A1 Jul. 27, 2017

Related U.S. Application Data

(63) Continuation-in-part of application No. 15/004,830, filed on Jan. 22, 2016, now Pat. No. 9,746,895, and a continuation-in-part of application No. 15/004,866, filed on Jan. 22, 2016, now Pat. No. 9,760,147.

(51) Int. Cl.
| G11C 11/00 | (2006.01) |
| G11C 7/20 | (2006.01) |
| G11C 14/00 | (2006.01) |
| G06F 1/32 | (2006.01) |
| G06F 3/06 | (2006.01) |

(52) U.S. Cl.
CPC .......... *G11C 11/005* (2013.01); *G06F 1/3225* (2013.01); *G06F 3/0619* (2013.01); *G06F 3/0631* (2013.01); *G06F 3/0688* (2013.01); *G06F 3/0689* (2013.01); *G11C 7/20* (2013.01); *G11C 14/0009* (2013.01)

(58) Field of Classification Search
CPC ..... G11C 11/005; G11C 7/20; G11C 14/0009; G06F 1/3225
See application file for complete search history.

(56) References Cited

U.S. PATENT DOCUMENTS

| 5,680,570 | A | * | 10/1997 | Rantala ............... G06F 11/0796 711/104 |
| 7,051,223 | B2 | | 5/2006 | Batchelor et al. |
| 7,634,688 | B2 | | 12/2009 | Madter et al. |
| 8,281,169 | B2 | | 10/2012 | Borras et al. |

(Continued)

OTHER PUBLICATIONS

"Platform design for connected standby"; Microsoft Hardware Dev. Center; Retrieved on: Oct. 28, © 2015; 2015; 5 pages.

(Continued)

*Primary Examiner* — Stefan Stoynov
(74) *Attorney, Agent, or Firm* — Workman Nydegger

(57) ABSTRACT

A computing device may comprise a processor, a volatile memory and a non-volatile storage device. An operating system or firmware of the device may cause one or more pages of the volatile memory to be treated, by applications executing on the computing device, as non-volatile memory pages. A number of pages that may be treated as non-volatile may be determined based on demand for non-volatile storage by at least one application executing on the computing device.

20 Claims, 15 Drawing Sheets

(56) References Cited

U.S. PATENT DOCUMENTS

| | | | |
|---|---|---|---|
| 8,296,496 B2* | 10/2012 | Mogul | G06F 12/023 |
| | | | 711/102 |
| 8,468,370 B2 | 6/2013 | Miller et al. | |
| 9,032,139 B2* | 5/2015 | Siddiqi | G06F 12/0246 |
| | | | 711/103 |
| 9,372,759 B2 | 6/2016 | Zheng et al. | |
| 2004/0054851 A1 | 3/2004 | Acton et al. | |
| 2007/0033433 A1 | 2/2007 | Pecone et al. | |
| 2007/0150760 A1 | 6/2007 | Nowlin | |
| 2010/0005285 A1 | 1/2010 | Yun | |
| 2010/0064159 A1 | 3/2010 | Wu et al. | |
| 2011/0268000 A1 | 11/2011 | Kashikar et al. | |
| 2014/0173242 A1 | 6/2014 | Huffman et al. | |
| 2014/0189387 A1 | 7/2014 | Vilhauer et al. | |
| 2014/0297927 A1* | 10/2014 | Katori | G06F 12/0638 |
| | | | 711/103 |

OTHER PUBLICATIONS

International Patent Application No. PCT/US2017/014377; Int'l Search Report and the Written Opinion; dated Apr. 28, 2017; 14 pages.

International Patent Application No. PCT/US2017/014353; Int'l Search Report and the Written Opinion; dated Apr. 28, 2017; 13 pages.

* cited by examiner

DEMAND-BASED PROVISIONING OF VOLATILE MEMORY FOR USE AS NON-VOLATILE MEMORY

CROSS REFERENCE TO RELATED APPLICATIONS

This Application is a continuation-in-part of U.S. patent application Ser. No. 15/004,830, filed Jan. 22, 2016, and titled "USE OF VOLATILE MEMORY AS NON-VOLATILE MEMORY," which issued as U.S. Pat. No. 9,746,895 on Aug. 29, 2017. This Application is also a continuation-in-part of U.S. patent application Ser. No. 15/004,866, filed Jan. 22, 2016, and titled "POWER CONTROL FOR USE OF VOLATILE MEMORY AS NON-VOLATILE MEMORY, "which issued as U.S. Pat. No. 9,760,147 on Sep. 12, 2017. The contents of each are incorporated herein by reference.

TECHNICAL FIELD

This disclosure relates generally to the operation of memory modules in a computing device. In particular, the disclosure relates to systems, methods, and computer program products for demand-based provisioning of volatile memory for use in providing non-volatile storage to applications executing on the computing device.

BACKGROUND

The main memory of a computing device is typically based on dynamic random-access ("DRAM") memory modules. DRAM has various properties suitable for use as main memory, such as low cost and high storage density. However, DRAM memory modules typically contain capacitors or other circuits that require a continuous, or nearly continuous, supply of power to prevent data loss. DRAM memory is therefore referred to as volatile, because data stored in DRAM memory is lost in the event that its power supply is interrupted.

Other types of memory, such as Negative-AND gate ("NAND") memory, may be referred to as non-volatile memory because a NAND memory module's contents are not lost if the module's power supply is interrupted. However, the main memory of a computer is not typically constructed from NAND memory modules, for various reasons such as higher cost, longer access times for read and write operations, and lower storage density compared to DRAM memory modules.

SUMMARY

A computing device may comprise a volatile memory and a non-volatile storage device. While the computing device is operating on utility power, the computing device may receive information indicative of how much energy would be available to the computing device if utility power were to be interrupted. The computing device may also determine how much energy would be needed to transfer a page of the volatile memory to the non-volatile storage device and, using this information, determine how many pages of memory could be preserved using the energy available in the battery. Based at least in part on this energy-related information, an operating system or firmware of the computing device may identify a number of pages of the volatile memory as non-volatile, such that applications executing on the computing device may store information on the pages of volatile memory as if the pages were non-volatile.

In addition to this energy-related information, the computing device may receive information indicative of how many pages of the volatile memory identified as non-volatile are being used by applications executing on the computing device. Based at least in part on this demand-related information, an operating system or firmware of the computing device may dynamically add or remove a number of pages of the volatile memory identified as non-volatile to reflect demand for non-volatile memory by the applications. In addition, subsequent cold-boots of the computing device may use the demand-related information to select an amount of volatile memory to identify as non-volatile.

An operating system of the computing device may receive information indicative of a first subset of the volatile memory pages identified by a firmware of the computer device as non-volatile storage. The operating system may send instructions to the firmware indicative of demand for additional non-volatile storage by at least one application executing on the computing device. The firmware may update data indicative of pages of memory identified as non-volatile storage to include a second subset of volatile memory pages in addition to the first subset of volatile memory pages that were previously identified as non-volatile to the operating system. The operating system may receive information indicative of updated data, and provide access to the second subset of volatile memory pages to the at least one application. The total amount of memory which the application may treat as non-volatile is thus increased to include both the first subset and the second subset.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present disclosure will be described more fully hereinafter with reference to the accompanying drawings, in which.

DETAILED DESCRIPTION OF ILLUSTRATIVE EMBODIMENTS

Figure 1:
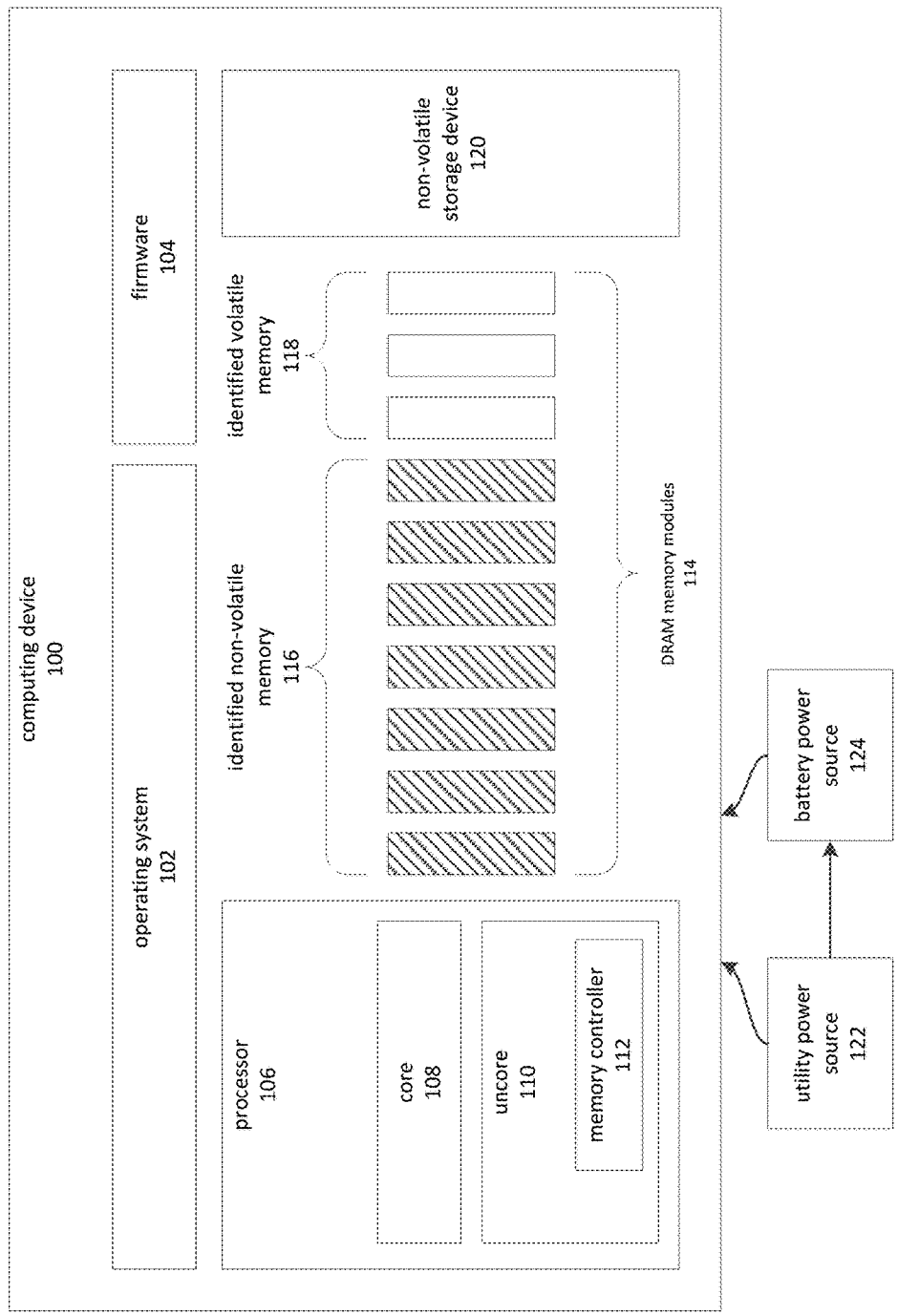
FIG. 1 is a block diagram that depicts an example computing system with volatile memory identified by the operating system as non-volatile memory.

A computing device may comprise a processor, a main memory comprising volatile memory modules, and a non-volatile storage device. The volatile memory modules may be memory whose contents are lost in the event of a power loss. The volatile memory modules may, in some cases, be memory modules whose endurance, with respect to retention of the contents stored in the memory, is relatively low compared to non-volatile memories.

Power to the computing device may be supplied by some combination of utility power and battery power. Utility power may refer to sources such as mains power delivered over a power grid. Utility power may also refer to other power sources that may generally be considered sustainable or typically available, such as locally generated solar, wind, or thermal power. Utility power may sometimes include battery components, such as batteries used in solar or wind power systems to store energy when there is a surplus and provide energy when there is a deficit. More generally, utility power may refer to any source of power that is typically available for an operating period of a computing device.

Battery power may refer to a backup source of energy, such as a device containing battery cells, capacitors, or other energy storage mechanism. When utility power is available, the battery may charge and the amount of power available to the computing device may increase. When utility power is not available, the computing device may operate on battery power and the amount of power available in the battery may decrease. Other factors, such as temperature, the age of the battery, and consumption of battery power by other devices may also affect the amount of available power.

The operating system or firmware of the device may represent volatile memory to applications as if the volatile memory were non-volatile. The amount of volatile memory that may be represented, or identified, as non-volatile may be determined based, in part, on two energy-related factors. The first energy-related factor may be the amount of energy available for use by the computing device in the event that utility power is suspended. The second energy-related factor may be an estimate of an amount power required to transfer a page of volatile memory to a non-volatile storage device.

Based, in part, on these energy-related factors, the operating system or firmware may determine an estimate of how many pages of memory could be preserved to the storage device should utility power be interrupted. These pages may then be identified, by the operating system or firmware, as being non-volatile.

Should utility power be interrupted, the computing device may enter a memory preservation phase in which the contents of volatile memory identified as non-volatile are preserved. During this phase, power delivery to components of the computing device may be restricted to those components needed for memory preservation. This may permit a greater amount of volatile memory to be identified as non-volatile. In addition, the power state during memory preservation may be such that predictions vis-a-vie energy consumption and availability are more reliable.

FIG. 1 is a block diagram that depicts an example computing system with volatile memory identified by the operating system as non-volatile memory. A computing device 100 may comprise memories bearing instructions of an operating system 102 and firmware 104, a processor 106, DRAM memory modules 114, and a non-volatile storage device 120.

The computing device 100 may typically operate on a utility power source 122. At times, such as when the utility power source 116 is interrupted, the computing device 100 may operate on a battery power source 124. During a blackout or other fault related to the utility power source 122, the computing device may switch or transfer its source of power from the utility power source 122 to the battery power source 124. In some instances, the battery power source 124 may be integrated into the computing device 100. In other instances, the battery power source may be external to the computing device 100.

The processor 106 may comprise various sub-components, including a core 108 and an uncore 110. The power consumption of the processor 106 may be controlled such that power to the core 108 and the uncore 110 may be suspended or maintained independently. For example, power delivery to the core 108 may be suspended while power to the uncore 110 may be maintained. Suspending power may comprise partially or totally interrupting the flow of energy to the affected component. Suspending power may also refer to placing the component in a low-power state. Typically, a component whose power has been suspended does not operate while power is suspended, but may resume operation once power has been restored. Maintaining power to a component may comprise delivering sufficient power to the component, such that the component may remain operative with respect to at least some of its functions.

The core 108 may comprise a processing unit of the processor 106. Typically, the processor 106 may comprise of number of cores, although for simplicity in representation FIG. 1 depicts the processor 106 as having a single core 108. As a processing unit of the processor 106, the core 108 typically executes computer-readable instructions, such as those of the operating system 102 and firmware 104, and thereby causes the computing device to perform various operations.

The uncore 110 may include portions of the processor 106 that are related to those of the core 108 but not included in it. In some cases the processor 106 may include one uncore 110 and a plurality of cores such as the depicted core 108. Typically, the uncore 110 may perform functions related to L3 cache maintenance and include a memory controller 112.

The memory controller 112 may control access to data stored in the DRAM memory modules 114. This may include performing direct-memory access ("DMA") operations. A DMA operation may involve transferring contents of memory. For example, a DMA operation may involve transferring contents of DRAM memory modules 114 to a non-volatile storage device 120. A DMA operation may be initiated by the core 108 executing instructions of the operating system 102 or firmware 104. Once the DMA operation has been initiated, the core 108 may resume other operations, or be placed in a low-power state or no-power state, while the DMA operation completes.

Interrupt signals may be transmitted to the processor 106. An interrupt signal may include signals or other transmissions from components of the computing device 100, or an external device such as the battery power source 124, of an event. Examples of interrupt signals include signals generated by network components, user interface components, and so forth. Various interrupt signals may, in some cases, be generated in response to error conditions or status changes that may arise during operation of the computing device 100. Interrupt signals may be generated in relation to DMA operations. For example, an interrupt signal might be generated in response to the completion of a DMA operation. Certain interrupts, such as those pertaining to DMA operations, may be processed by the uncore 110.

The battery power source 124 may also supply interrupt signals, or other communications, to the computing device 100. The communications may be indicative of changes to the state of the battery power source 124. The state information may, for example, include information indicating whether the battery power source 124 is currently being charged from utility power source 122 and how much battery power is available to the computing device 100. In some instances, the battery power source 124 may supply power to a number of devices, so the amount of power available to the computing device 100 may be less than the total amount of power stored in the battery.

The DRAM memory modules 114 may be sub-divided into units of memory sometimes referred to as pages. The pages of memory may be associated with certain characteristics, such as memory speed and volatility. For example, the DRAM memory modules 114 may be volatile RAM, such that if power to the DRAM memory modules 114 is suspended, the contents of the DRAM memory modules 114 will be lost. The characteristics of the memory may be conveyed to application programs that execute on the computing device 100. In some instances, firmware 104 may determine the characteristics of the DRAM memory modules 114 at boot time and convey this information to the operating system 102. The operating system 102 may then convey these characteristics to an application program.

A page of memory, as used herein, may refer to a portion of memory within a memory module. In some instances, a page of memory, sometimes referred to as a region of memory or a portion of memory, may be grouped or logically partitioned by a characteristic of the memory device. For example, a page, region, or portion of memory might correspond to a memory whose contents may be readable or writable in a single operation. In another example, a page, region, or portion of memory might share a cache line. In other instances, the boundaries of pages, regions, or portions of memory may be logically partitioned by a memory controller, firmware, or operating system.

As noted, the DRAM memory modules 114 may be volatile RAM. However, the firmware 104 and/or operating system 102 may identify pages of the volatile DRAM memory modules 114 as being non-volatile memory. The identification may comprise conveying information about characteristics of the memory to a user of the memory. For example, the firmware 104 might report to the operating system 102 that certain pages of the DRAM memory modules 114 are non-volatile memory pages. This may, for example, involve updating system description tables, such as system description tables defined by the Advanced Configuration and Power Interface ("ACPI"). The operating system 102 might report this information to an application that is running on the computing device 100. An application running on the operating system might determine that the operating system has identified a page of memory as non-volatile by invoking an operating system application programming interface ("API"), by inspecting an ACPI system description table, and so forth. Note that in some cases, identifying memory as non-volatile may involve the firmware or operating system recording that the page of memory should be treated as non-volatile, without explicitly or implicitly notifying a user of the page of memory.

The number of pages identified as volatile or non-volatile may depend on a variety of energy-related factors, including an amount of power available in the battery power source 124 and an amount of power needed to preserve the contents of a page of volatile memory that has been identified as being non-volatile. As discussed in greater detail below, the number of pages identified as volatile or non-volatile may also depend on a variety of demand-related factors. Accordingly, DRAM memory module 114 may comprise an identified non-volatile memory 116 portion and an identified volatile memory 118 portion.

Applications running on the computing device 100 may adapt their processing by, for example, writing data to memory identified as non-volatile memory without necessarily performing additional steps to ensure that the data has been committed. Applications may, in some cases, achieve higher performance when greater amounts of memory are identified as being in non-volatile commit mode. An application may, for example, bypass processing related to ensuring that a write has been committed, if the write was to a region of memory that has been identified as non-volatile.

Figure 2:
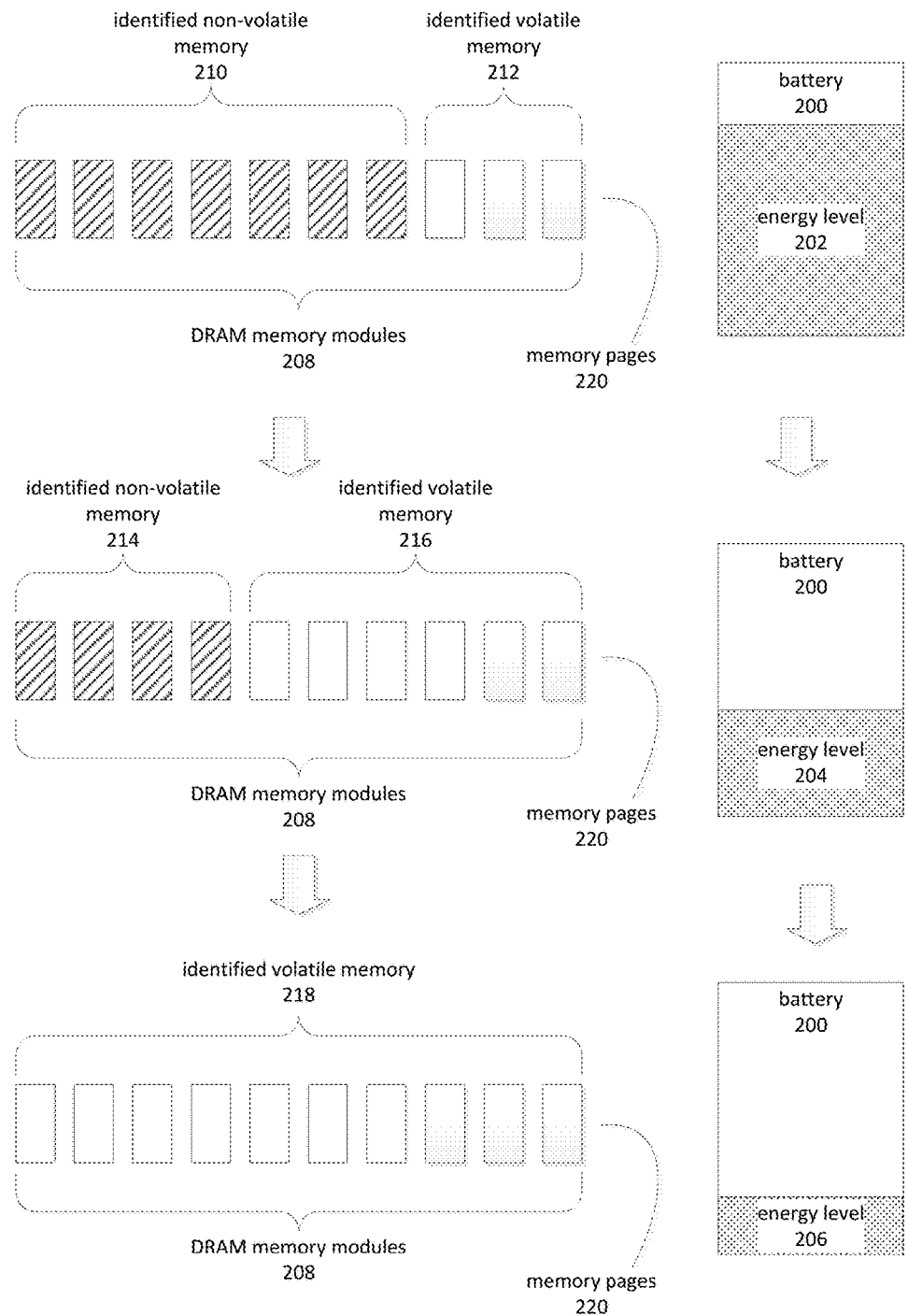
FIG. 2 is a block diagram that depicts adjusting the number of pages identified as non-volatile based on available battery power.

FIG. 2 is a block diagram that depicts adjusting the number of pages identified as non-volatile based on available battery power. FIG. 2 depicts a battery 200 and DRAM memory modules 208. Three states of the battery 200 are shown, corresponding to three energy levels 202, 204, 206. The example of FIG. 2 is intended to illustrate an embodiment of a computing device, such as the computing device 100 depicted by FIG. 1, which adjusts the amount of memory identified as non-volatile based on energy available to the device. In the example of FIG. 2, the computing device 100 may be operating on utility power while the amount of energy available in battery 200 fluctuates over time. Although FIG. 2 depicts a decreasing amount of battery power, in some instances the amount of energy might increase over time, and principles similar to those depicted in FIG. 2 may be applied. The amount of energy might fluctuate for various reasons. For example, in some cases battery 200 might be connected to multiple computing devices, some of which might draw power from the battery 200 while the computing device 100 remains on battery power. In another example, temperature or other operating conditions of the battery might cause the amount of energy available. In another example, the maximum capacity of the battery might degrade over time.

At energy level 202, an amount of energy in battery 200 may be sufficient to perform memory transfers on some number of the memory pages 220. In FIG. 2, for example, the amount of energy in the battery 200 at energy level 202 may be sufficient to transfer the contents of seven of the ten depicted memory pages 220. The operating system or firmware may determine the number of memory pages that may be transferred based on factors such as the amount of memory in each page, the amount of energy used to perform a DMA operation, the amount of energy used by devices whose power is maintained during the memory transfer operations, and so forth. When the battery 200 has a greater amount of energy available, a greater number of pages may be identified as non-volatile memory 210, and fewer pages may be identified as volatile memory 212.

At a reduced energy level 204, the amount of energy available for transferring the contents of memory pages 220 may also be reduced. There may, for example, be sufficient memory for transferring four memory pages using the available battery power. The operating system or firmware may identify four memory pages as non-volatile memory 214 and six pages identified as volatile memory 216.

Similarly, at a further reduced energy level 206, the battery 200 may not be able to supply sufficient battery power to transfer any of the pages of DRAM memory modules 208 to a non-volatile storage device. The operating system or firmware might then identify all of the pages of the DRAM memory modules 208 as volatile memory 218.

When a page of memory has been identified as non-volatile memory, its contents may be preserved prior to being subsequently identified as volatile memory. For example, when an amount of energy available in battery 200 has been reduced from energy level 202 to energy level 204, three pages of identified non-volatile memory 210 may then transition to being identified as volatile memory 216. The operating system or firmware may transfer the contents of the three pages of previously identified non-volatile memory 210 in response determining to transition the pages to be identified as volatile-memory 216. The contents of the memory may be transferred while the computing device 100 is still using utility power, and accordingly the amount of energy available in the battery 200 is not affected by the transfers.

If utility power were to fail prior to completing the transfers, there might not be sufficient energy available to transfer all of the memory pages previously identified as non-volatile memory 210. The risk of this occurrence may be mitigated in various ways, including but not limited to more frequent adjustments to the number of pages of memory that are identified as non-volatile, and incorporating greater tolerance to battery fluctuation in the calculations used to determine the number of pages of memory to identify as non-volatile. For example, the number of pages to identify as non-volatile may be reduced in proportion to the amount of power-level fluctuation in the battery.

Figure 3:
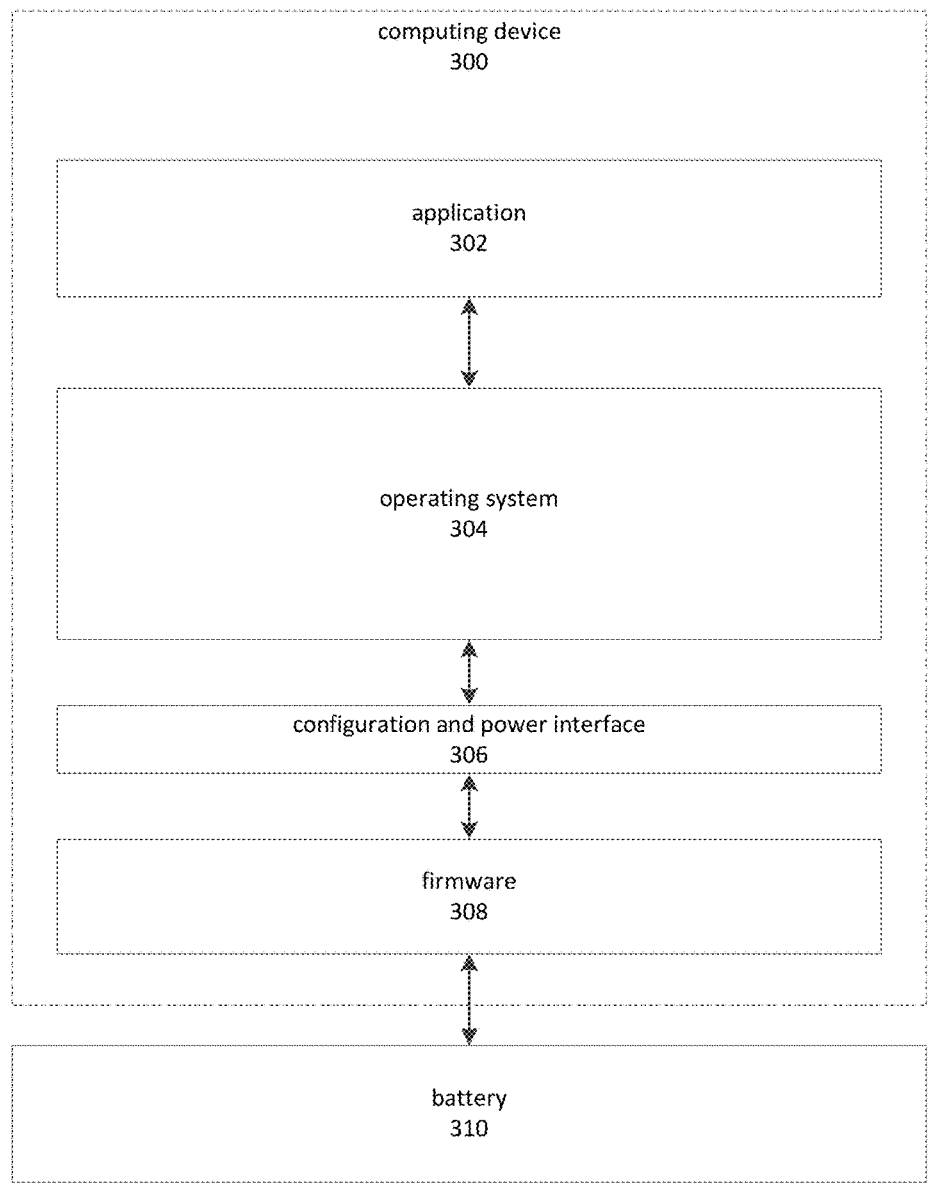
FIG. 3 is a block diagram depicting an example of a computing device identifying volatile memory as volatile or non-volatile memory.

FIG. 3 is a block diagram depicting an example of a computing device identifying volatile memory as volatile or non-volatile memory. A computing device 300 may comprise firmware 308 that receives communications from a battery 310. The battery 310 may, for example, send data containing information about the current state of utility power, the amount of energy available in the battery 310, and so forth. In some instances, the battery 310 may provide various metrics and history information, such as the dates, times, and durations of utility power interruptions.

The firmware 308 may be a basic input/output system ("BIOS"). The firmware 308 may initialize various hardware devices and components of the computing device 300. The firmware 308 may also be involved in various aspects of operations at runtime. In some instances, the firmware 308 may provide an abstraction layer for the hardware components of the computing device 300, through which the operating system 304 accesses the hardware of the computing device 300.

A configuration and power interface 306 may provide the operating system 304 with access to information and updates pertaining to the memory configuration of the computing device 300. In some instances, the configuration and power interface may comprise the Advanced Configuration and Power Interface ("ACPI"). The firmware 308 may provide configuration tables, through ACPI, that describe the characteristics of various memory modules installed on the computing device. In some instances, these tables might describe the characteristics of the memory modules as they are—volatile memory being reported as volatile memory, and non-volatile memory being reported as non-volatile. In other instances, the tables might be used to indicate that some proportion of the volatile memory modules, including potentially all of the volatile memory modules, is non-volatile. The tables might, in some cases, provide an indication that the non-volatile characteristic of the memory is simulated by the firmware or operating system. In other cases, the table might not include an indication that the non-volatile characteristic is not that of the memory module itself.

The operating system 304 may enable the execution of various programs, processes, and sub-processes. These may be referred to herein as applications, such as the application 302 depicted in FIG. 3. The application 302 may utilize memory identified as non-volatile in various ways. In an example, the operating system 304 may provide the application 302 with access to memory that is identified as non-volatile using an application programming interface ("API"). This might comprise invoking a heap creation or memory allocation API and specifying a flag indicating that the returned heap or memory segment should be a non-volatile memory page. In some instances, the application might be able to specify whether or not the non-volatile characteristics of the supplied memory may be provided by the operating system or firmware. In other instances, pages based on volatile memory modules may be supplied transparently, such that the application may not necessarily comprise instructions that are adapted to the simulated non-volatility of the provided memory.

Data pertaining to the status of the battery 310 may be distributed to various components of the computing device 300, including firmware 308. The firmware 308 may, for example, receive or otherwise obtain data from the battery 310. The firmware 308 may distribute the information via the configuration and power interface 306 to the operating system 304. The operating system 304 may then apply the information by adjusting the amount of memory identified as non-volatile. The amount of memory identified as non-volatile may be determined based on various factors such as performance-to-risk ratio, estimated probability and length of utility power interruptions, the health of the battery, the rate at which battery power fluctuates, and so on.

The operating system 304 may respond to increases in the amount of energy available for use by the computing device 300. The response may include increasing the amount of memory identified as non-volatile. For example, the operating system 304 may select additional pages of DRAM memory modules for identification as non-volatile memory pages. This may involve providing the application 302 with access to a page of a selected DRAM module, identifying the page as being non-volatile, and causing the contents of the memory page to be transferred to a non-volatile storage device in the event of a utility power failure, or system shutdown. The memory contents may also be transferred to a non-volatile storage device to make room for subsequent write operations to non-volatile memory, or for other reasons.

The operating system 304 may respond to decreases in the amount of energy available for use by the computing device 300. Aspects of the response may include selecting pages of DRAM memory modules previously identified as non-volatile and causing those pages to instead be identified as volatile. As noted, the identification process may include updating system configuration tables to indicate whether a page of memory is volatile or non-volatile. When the amount of energy available in the battery 310 has been reduced, the table may be updated such that pages previously indicated as non-volatile are indicated as volatile. Another aspect of the response may include transferring the contents of these deselected pages to a non-volatile storage device. The deselected page may have contents not yet preserved on a non-volatile storage device, and as such the contents may be preserved when the page is deselected. This may be avoided when no unpreserved data has been written to the deselected page. As such, in some cases, pages whose contents have already been preserved, or to which no data has yet been written, may be preferred as targets for deselection.

Figure 4:
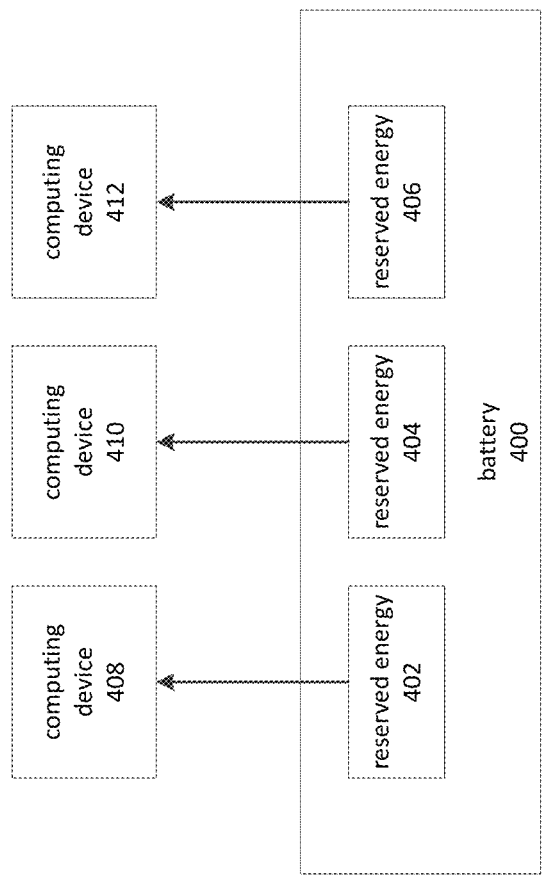
FIG. 4 depicts a battery shared by multiple computing devices.

The battery 310 may be shared by devices in addition to computing device 300. FIG. 4 depicts a battery shared by multiple computing devices. A battery 400 may provide reserve operating power to a number of computing devices 408, 410, 412. The battery 400 may also provide, or allow access to, data pertaining to the state of the battery 400.

A portion of battery power may be reserved for use by each of the computing devices 408, 410, 412. As depicted by FIG. 4, each of computing devices 408, 410, 412 may have a reserved energy portion 402, 404, 406. The reserved energy portions 402, 404, 406 may be reserved for use, by the respective computing devices 408, 410, 412, in the event that utility power is interrupted. In some instances, the reserved energy portions 402, 404, 406 may be reserved particularly for transferring the contents of DRAM memory modules that have been identified as non-volatile.

The amount of energy in the reserved energy portions 402, 404, 406 may be based on factors such as a target amount of memory to be identified as non-volatile. For example, computing device 408 might be configured to aggressively identify DRAM memory modules as non-volatile. As such, the reserved energy portion 402 for computing device 408 might be made larger than that of the other reserved energy portions 404, 406. Other factors that might be incorporated into the amount of energy reserved may be risk tolerance, estimated probability of losing utility power, battery health, and so forth. A model of energy needed to transfer the contents of memory may be used in conjunction with a model of the supply of energy from the battery. Each of the computing devices 408, 410, 412 may use the models to determine how much memory may be identified as non-volatile without interfering with the power requirements of the other computing devices 408, 410, 412.

The energy in battery 400 may be reserved by the operating systems or firmware of the computing devices 408, 410, and 412. For example, the operating system of computing device 408 may receive or otherwise obtain information about other users of the battery 400, such as the other depicted computing devices 410, 412. The information may include factors that may affect the amount of energy reserved for each portion. In the event that utility power is interrupted, the computing device 408 may act within its assigned "power budget," e.g. by using only the amount of reserved energy 402, to transfer the contents of memory identified as non-volatile.

Figure 5:
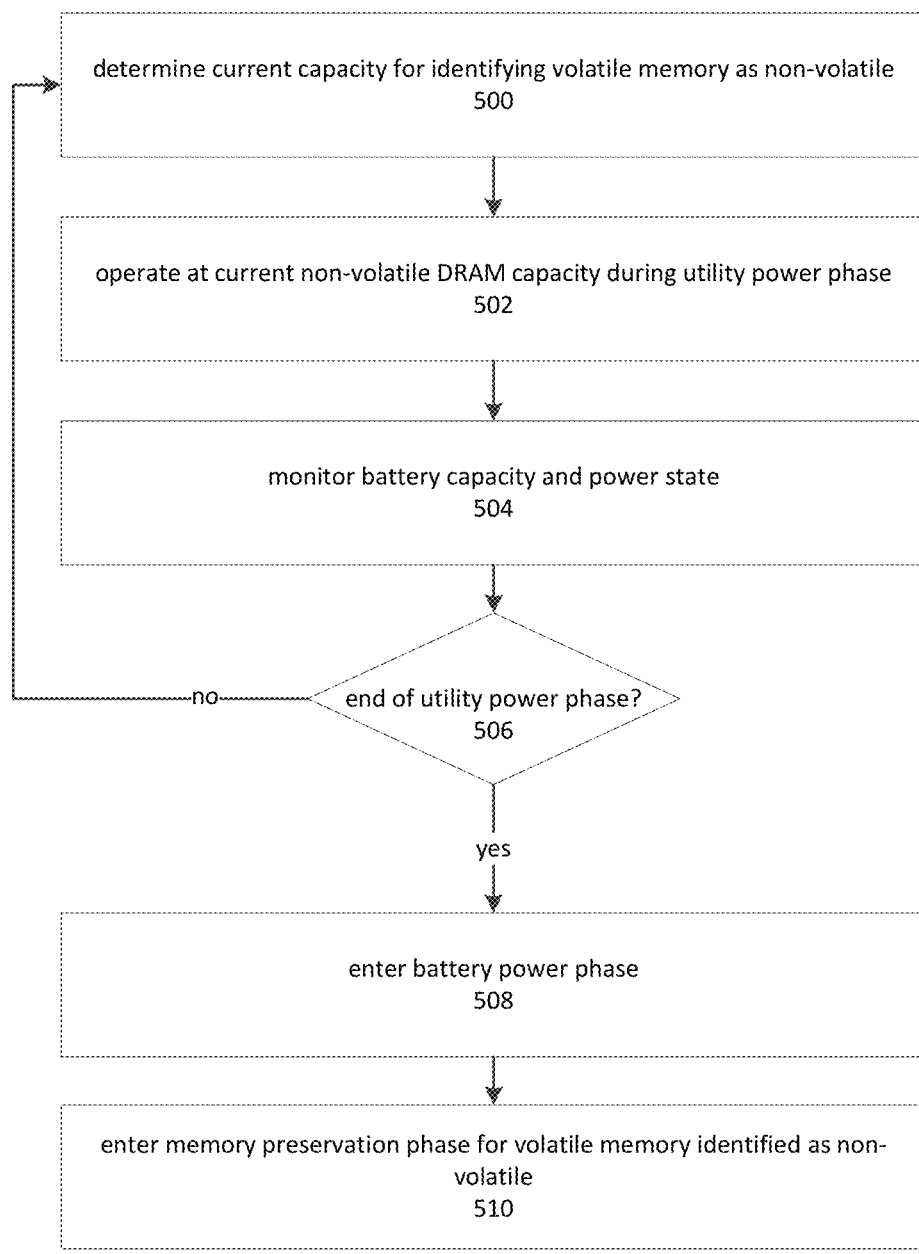
FIG. 5 is a flow diagram depicting an example process for operating a computing device with volatile memory identified as non-volatile memory.

FIG. 5 is a flow diagram depicting an example process for operating a computing device with volatile memory identified as non-volatile memory. Although FIG. 5 is depicted as a sequence of blocks, it will be appreciated that the depicted sequence should not be construed as limiting the scope of the present disclosure to embodiments that adhere to the depicted sequence. Moreover, it will be appreciated that, in some embodiments of the present disclosure, certain of the operations indicated by the depicted blocks may be altered, reordered, performed in parallel, or omitted.

During the operation of a computing device, such as the computing device 100 depicted in FIG. 1, the operating system or firmware of the computing device may periodically determine how much memory may be identified as non-volatile, based at least in part on the amount of energy needed to transfer the contents of that memory to a non-volatile storage device. Block 500 depicts determining a current capacity for identifying volatile memory modules as non-volatile, where the capacity may be limited by the amount of energy available to preserve the contents of memory in the event that utility power is interrupted.

Block 502 depicts the computing device operating with a number of volatile memory pages identified as non-volatile during a utility power phase. The utility power phase may refer to times when utility power is available to the computing device. In some instance, the utility power phase may include periods of time in which utility power is interrupted, but for a length of time that is below a threshold length of time. The threshold may be based on an estimated probability that power will be restored before the threshold length of time has elapsed. The utility power phase may then continue if there are comparatively short periods of interruption.

The operations of block 504 may also be performed during the utility power phase. During this time, as depicted by block 504, the computing device may monitor battery capacity and power state. Monitoring capacity may involve receiving or otherwise obtaining information about the amount of power stored in the battery. The computing device may, moreover, monitor the amount of power that is both stored in the battery and reserved for use by the computing device in the event of a power failure. Monitoring the power state may involve receiving or otherwise obtaining information indicating whether or not the computing device and/or battery is currently being supplied with utility power, or if some other condition is causing the amount of available energy in the battery to be reduced.

As depicted by block 506, the operations of blocks 500 to 504 may be repeated while the utility power phase continues. If utility power fails or is otherwise interrupted, the operations of blocks 508 and 510 may be performed.

As depicted by FIG. 5 and explained herein, the utility power phase may be associated with transient interruptions in utility power. However, the duration of the outage may be such that the computing device may enter a phase in which its behavior is adapted to the use of battery power. Block 508 depicts entering a battery power phase in which the operation of the computing device is adapted to the usage of battery power. With respect to identifying volatile memory as non-volatile memory, the operation of the computing device may be adapted in various ways. For example, the computing device might cease to identify new pages of volatile memory as non-volatile, and might opportunistically deselect volatile memory pages as non-volatile when the contents of those pages is transferred to a non-volatile storage device. The degree to which this occurs may be based on various factors, such as tuning parameters that allow a risk versus performance tradeoff to be specified.

The operations of block 510 may be delayed until the amount of energy available in the battery has been reduced to a point that, were the battery drain to continue, there might not be enough energy available to preserve the contents of volatile memory that had been identified as non-volatile. Block 510 depicts entering a memory preservation phase for volatile memory that had been identified as non-volatile. In this phase, the computing device may enter a state in which power consumption is at primarily directed to preservation of the contents of memory identified as non-volatile.

Figure 6:
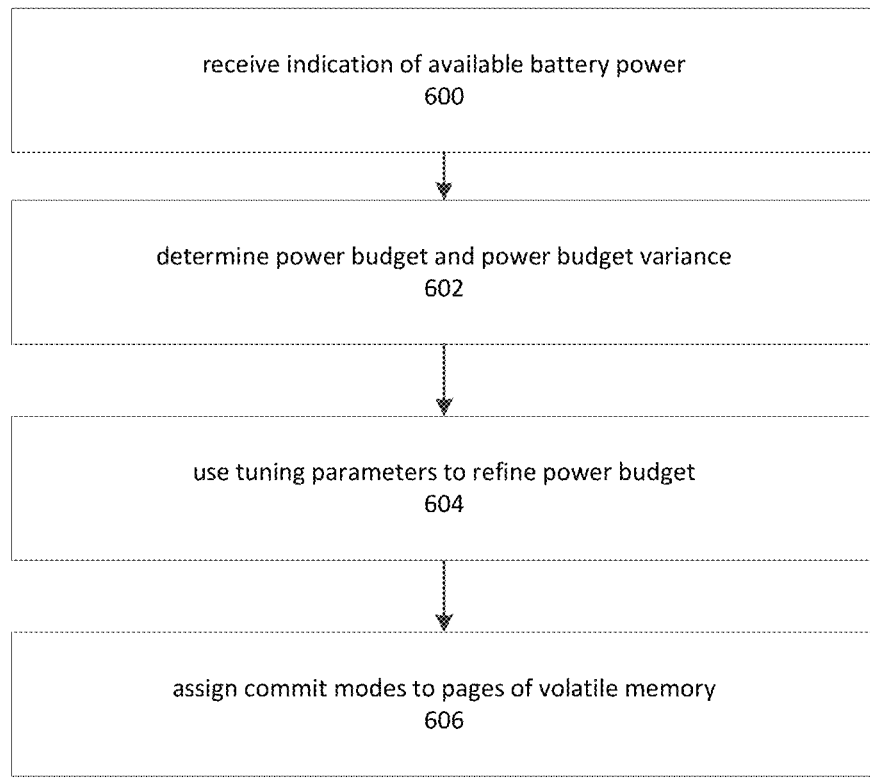
FIG. 6 is a flow diagram depicting an example of a process for adjusting non-volatile memory identification based on application performance parameters.

The amount of memory identified as non-volatile may have an effect on performance of a computing device. Application performance may be increased, in some instances, by identifying a greater amount of memory as non-volatile and using various techniques described herein to ensure that data written to volatile memory is preserved. FIG. 6 is a flow diagram depicting an example of a process for adjusting non-volatile memory identification based on application performance parameters. Although depicted as a sequence of blocks, it will be appreciated that the depicted sequence should not be construed as limiting the scope of the present disclosure to embodiments that adhere to the depicted sequence. Moreover, it will be appreciated that, in some embodiments of the present disclosure, certain of the operations indicated by the depicted blocks may be altered, reordered, performed in parallel, or omitted.

Block 600 depicts a computing device receiving an indication of available battery power. The indication may include information sufficient to determine how much of the available power would be reliably available should the computing device enter a memory preservation mode, as depicted by block 510 of FIG. 5.

Block 602 depicts determining a power budget and a power budget variance. The power budget may refer to the allocation of battery power in the event that a memory preservation mode is entered. For example, the power budget might include allocations of the available battery power to operate a core, an uncore, one or more memory modules, and the non-volatile storage device in order to preserve the contents of memory identified as non-volatile. The power budget might also include allocations for other devices.

The power budget variance may refer to an estimated reliability of the power budget. This may include adjustments for factors such as the amount of available power and the amount of power that items in the power budget might actually consume during a memory preservation phase. For example, a more aggressive power budget might assume that some percentage of memory pages identified as non-volatile would not actually need to be preserved during a memory preservation phase, since they may have already been preserved in the course of normal operations, or they may have never been written to and thus contain nothing to be preserved. However, if these assumptions turn out to be inaccurate, the memory budget may be exceeded.

Block 604 depicts using tuning parameters to refine the power budget. For example, a tuning parameter might be an operating system or firmware configuration element that indicates how aggressively the computing system should identify volatile memory as non-volatile. For example, in some applications it may be acceptable to risk data being lost in the event of system failure. The power budget might then be adjusted to permit greater amounts of volatile memory to be identified as non-volatile. For other applications, data loss may be viewed as unacceptable. For these applications, the operating system or firmware configuration element might indicate that the power budget should be computing based on pessimistic projections of power usage during a memory preservation phase.

At block 606, the computing device may assign commit modes to pages of volatile memory. In other words, the computing device may determine to identify certain pages of volatile memory as having a non-volatile commit mode, while other pages may remain in a volatile commit mode. Here, the commit mode may refer to whether or not a write may be viewed as committed, i.e. persistent, when it is written to memory.

The computing system may select pages of memory for a non-volatile commit mode based on the power budget. This may include selecting up to the maximum number of pages of memory permitted by the power budget to have a non-volatile commit mode. It may also include selecting pages to maximize the number of pages that may be associated with a non-volatile commit mode, while remaining consistent with the power budget. In some instances, the selected pages may be grouped by memory module, so that the total number of memory modules having non-volatile commit mode pages may be reduced and conformance with the power budget may be increased.

Figure 7:
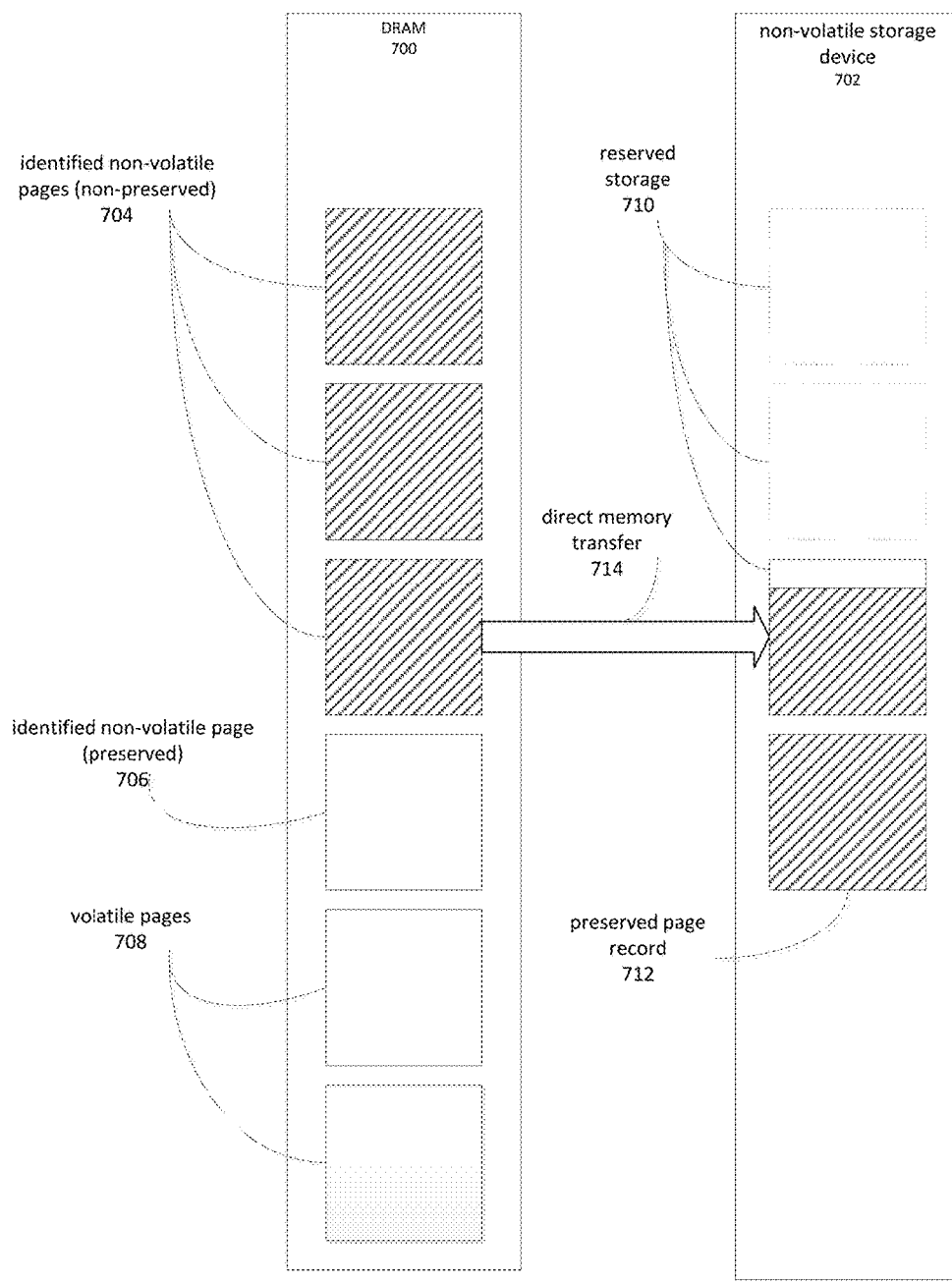
FIG. 7 is a block diagram providing an example of preserving the contents of volatile memory.

FIG. 7 is a block diagram providing an example of preserving the contents of volatile memory. A DRAM memory module 700, having volatile memory characteristics, may comprise a number of pages of memory. Because the depicted DRAM memory module 700 is volatile, all of its constituent memory pages are volatile, i.e. their contents will be lost if power to the DRAM memory module 700 is interrupted. However, as noted herein, certain pages may be identified as being non-volatile, and thereby treated as non-volatile by applications executing on the computing device. As depicted by FIG. 7, the DRAM memory module may contain identified non-volatile pages 704, 706. Of these, some memory pages 704 may contain unpreserved content, while other memory pages 706 might contain content that has already been preserved, or equivalently the memory page 706 might not have ever been written to, and thereby has nothing to be preserved. The DRAM memory module 700 might also contain pages of memory that 708 that are not currently identified as volatile.

In the example of FIG. 7, the contents of the identified non-volatile page 706 may have been previously preserved by transferring the contents of the page 706 to the non-volatile storage device 702. The contents of the page 706 are indicated as being stored on the non-volatile storage device 702 by the preserved page record 712.

The contents of one or more pages of memory identified as non-volatile, but not yet preserved 704 may be preserved on the non-volatile storage device by a direct memory transfer operation 714. For example, a processor and memory controller may cause a DMA operation to transfer the contents of a page to the non-volatile storage device 702.

Regions of the non-volatile storage device 702 may be held in reserve. This is depicted in FIG. 7 by elements entitled reserved storage 710. The reserved storage 710 may include regions of space sufficient to store the contents of pages of memory identified as non-volatile 704 and 706. The amount of memory identified as non-volatile may, in some instances, be based partly on the amount of storage space available on the non-volatile storage device 702, since a lack of available storage space might prevent the contents of memory identified as non-volatile from being preserved.

Figure 8:
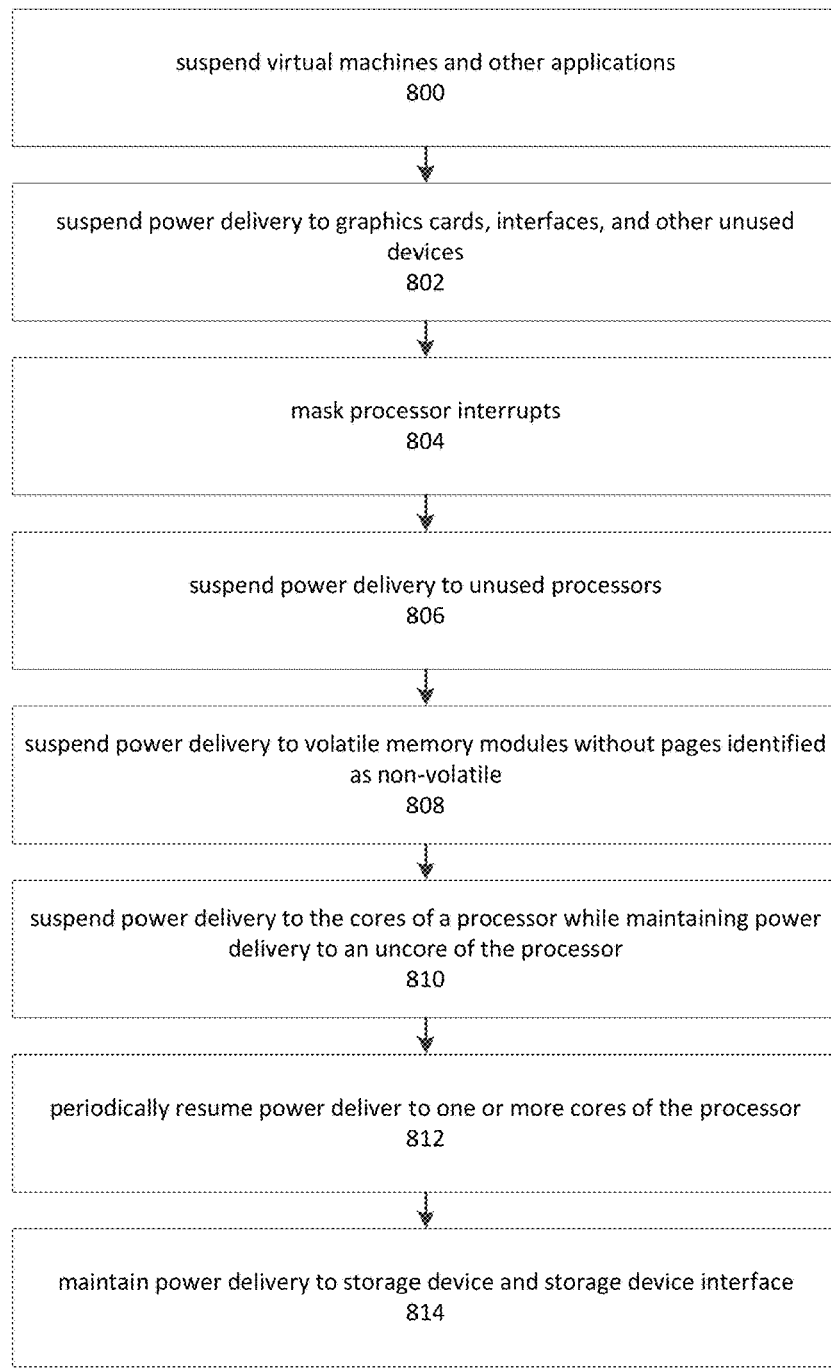
FIG. 8 is a flow diagram depicting an example process for preserving the contents of volatile memory identified as non-volatile.

The memory preservation phase may begin by entering a low-power state adapted to preserving the contents of volatile memory. The low-power state may permit FIG. 8 is a flow diagram depicting an example process for preserving the contents of volatile memory identified as non-volatile. Although depicted as a sequence of blocks, it will be appreciated that the depicted sequence should not be construed as limiting the scope of the present disclosure to embodiments that adhere to the depicted sequence. Moreover, it will be appreciated that, in some embodiments of the present disclosure, certain of the operations indicated by the depicted blocks may be altered, reordered, performed in parallel, or omitted.

Block 800 depicts the computing device suspending virtual machines or other applications, such as databases, for which a period of time to become quiescent is desired. For example, upon a determination that the computing device has entered a memory preservation phase, or is about to, various applications such as virtual machines may be notified and given a controlled period of time in which they may save as much uncommitted data as possible. Data written to memory identified as non-volatile may, in some instances, be treated by the application as if it were in a committed state, since the operating system and/or firmware will preserve the contents of the memory during the memory preservation phase.

At block 802, the computing device may begin to enter the low-power state by suspending power delivery to certain devices not needed during the remainder of the memory preservation phase. These devices may include graphics cards, user interface busses, networking cards, and so forth.

As depicted by block 804, the computing device may also mask processor interrupts. For example, all processor interrupts may be masked except those related to certain errors and those needed for processing memory transfer operations, such as DMA operations.

Block 806 depicts that power delivery to unused processors, including all associated cores, uncores, and other processor components, may be suspended. In this context, unused may refer to those processors not needed for performing the memory preservation. For example, in some instances a single processor, or a single core of the single processor, may be sufficient to complete memory preservation. Power delivery to the remaining processors of the computing system may therefore suspended during the memory preservation phase. Note that in some instances an interrupt may wake a processor and cause power delivery to be resumed. The interrupt masking depicted by block 804 may prevent this occurrence and keep the unused processors in a low-power or no-power state.

Block 808 depicts that the computing device may also suspend power delivery to volatile memory modules that have no pages identified as non-volatile. The computing device may also suspend power to any volatile memory modules whose contents have already been preserved. In addition, the computing device may also suspend power to any memory modules that are inherently non-volatile, such as negative-AND gate ("NAND") memory modules.

In various instances, the computing device may prioritize memory transfer operations involving volatile memory modules that may be completed earliest. For example, the computing device may prioritize transferring the contents of a first memory module over the contents of a second memory module, if the contents of the first memory module may be preserved more quickly than the contents of the second memory module. This approach may allow power delivery to the first memory module to be suspended sooner than power delivery to the second memory module, resulting in an overall decrease in the amount of energy used in the memory preservation phase.

Block 810 depicts that the computing device may suspend power delivery to a core of a processor while maintaining power delivery to an uncore of the processor. For multicore processors, power delivery to all of the cores may be suspended. During the memory preservation phase, power delivery to one or more of the cores may be resumed periodically. When restored, the core may be used to initiate a memory transfer operation, after which power delivery may again be suspended. This is depicted by block 812. Meanwhile, power delivery to an uncore of the processor is maintained. The uncore, containing a memory controller, may oversee the memory transfer operation and cause power delivery to the core of the processor to be resumed when the transfer is completed.

As depicted by block 814, power delivery to the non-volatile storage device, as well as any interfaces or communications busses required to write to the storage device, may be maintained during the memory preservation phase so that the memory transfer operations may be completed.

Figure 9:
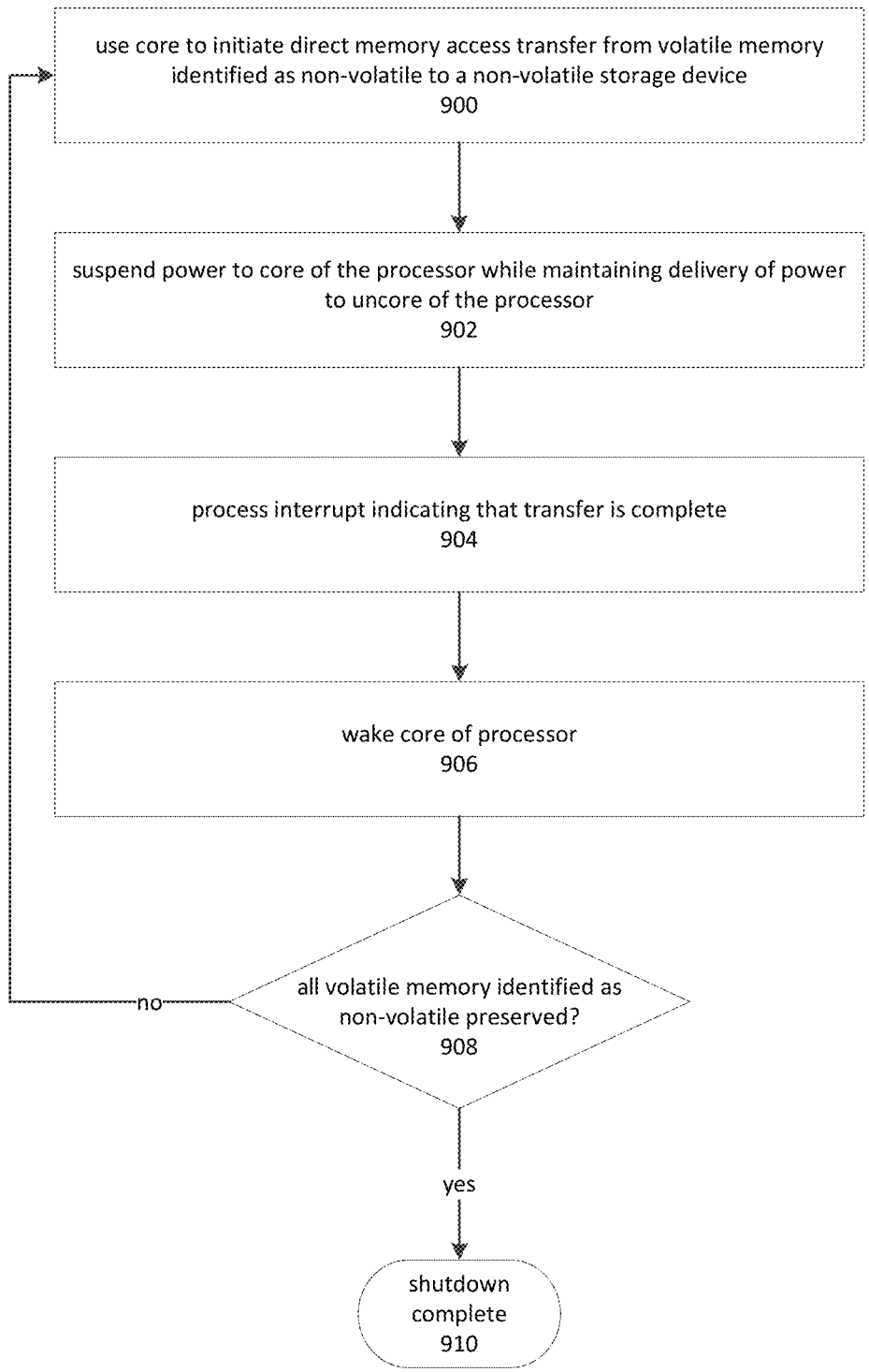
FIG. 9 is a flow diagram depicting an example of controlling power delivery to a processor core during memory preservation.

FIG. 9 is a flow diagram depicting an example of controlling power delivery to a processor core during memory preservation. Although depicted as a sequence of blocks, it will be appreciated that the depicted sequence should not be construed as limiting the scope of the present disclosure to embodiments that adhere to the depicted sequence. Moreover, it will be appreciated that, in some embodiments of the present disclosure, certain of the operations indicated by the depicted blocks may be altered, reordered, performed in parallel, or omitted.

Block 900 depicts that the core of a processor may execute instructions to initiate a direct memory transfer operation from volatile memory module to a non-volatile storage device. The direct memory transfer operation may copy pages of the volatile memory modules that had been identified as non-volatile to the non-volatile storage device.

Block 902 depicts suspending power to the core of the processor after it has initiated a direct memory transfer operation. The direct memory transfer operation may be ongoing while power is suspended. Power delivery to an uncore of the processor may be maintained during this time.

As depicted by block 904, an interrupt may be generated to indicate that the memory transfer operation is complete. The interrupt may be generated by the uncore's memory controller. Processing of the interrupt signal may include causing the core to reawaken by at least resuming power delivery to the core. This operation is depicted by block 906.

At block 908, the awoken core may execute instructions to determine whether all volatile memory previously identified as non-volatile has been preserved. This may comprise executing instructions that examine records of volatile memory pages identified as non-volatile and information indicating whether contents of the corresponding pages has already been preserved, does not need preservation because it has not been written to, or still needs to be preserved.

If all volatile memory identified as non-volatile memory has been preserved, or does not require preservation, the system may shutdown as depicted by block 910. Otherwise processing may resume at block 900, where the awoken processor may initiate an additional memory transfer operation.

Figure 10:
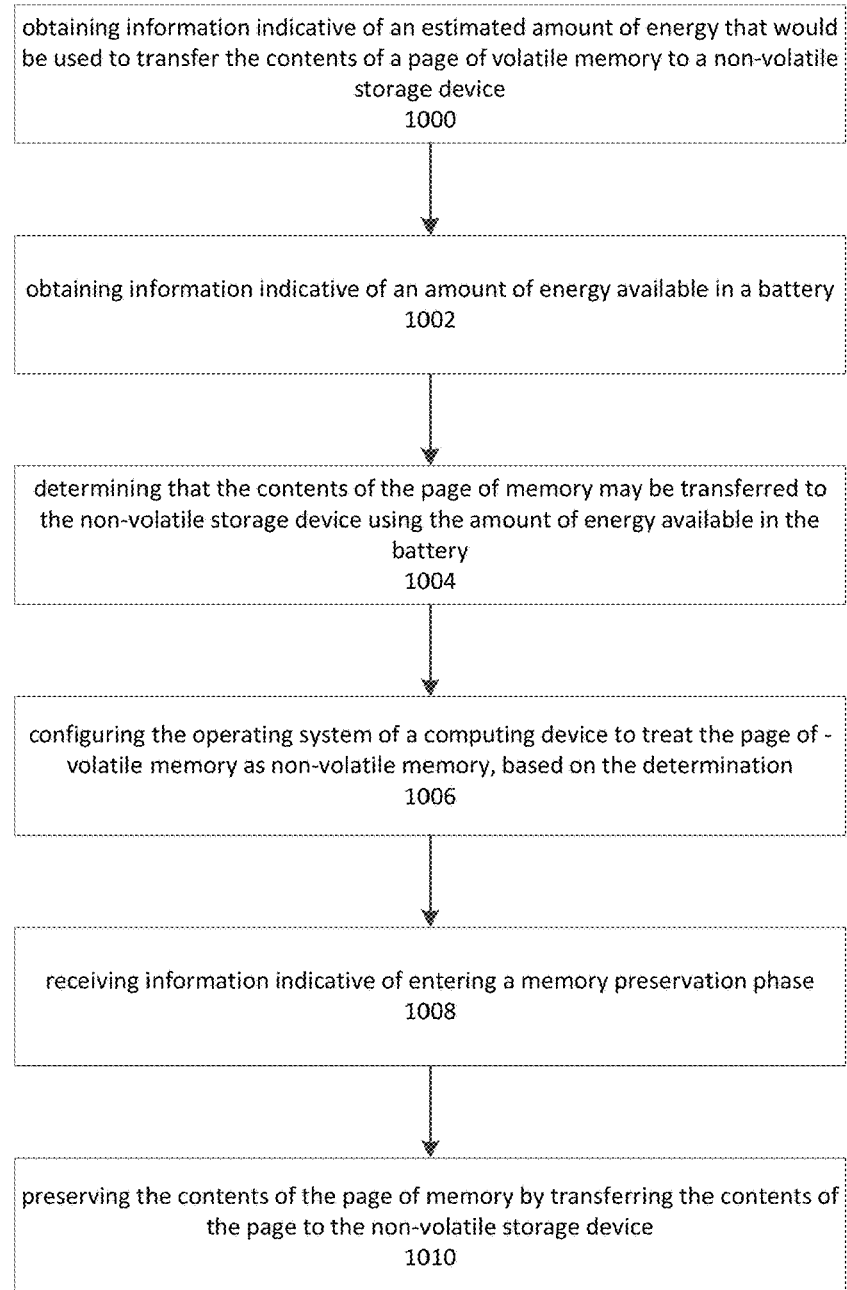
FIG. 10 is a flow diagram depicting an example of operating a computing device with volatile memory modules identified as non-volatile.

FIG. 10 is a flow diagram depicting an example of operating a computing device with volatile memory modules identified as non-volatile. Although depicted as a sequence of blocks, it will be appreciated that the depicted sequence should not be construed as limiting the scope of the present disclosure to embodiments that adhere to the depicted sequence. Moreover, it will be appreciated that, in some embodiments of the present disclosure, certain of the operations indicated by the depicted blocks may be altered, reordered, performed in parallel, or omitted.

Block 1000 depicts obtaining information indicative of an estimated amount of energy that would be used to transfer the contents of a page of volatile memory to a non-volatile storage device. The information may be obtained from observation, experimentation, metrics recorded during operation of the computing device, and so forth. The information may, in some cases, be supplied by configuration parameters. The information may include the amount of energy used to perform a DMA transfer operation to the non-volatile storage device. The information may also include energy used by a processor core to initiate the DMA transfer, and the amount of energy consumed by the non-volatile storage device. Other power consumption factors may also be included.

Block 1002 depicts obtaining information indicative of an amount of energy available in a battery. The information may be obtained, for example, from messages sent from the battery to the computing device, or from a polling mechanism initiated by the computing device. These examples are illustrative, and should not be construed as limiting.

Block 1004 depicts determining that the contents of the page of memory may be transferred to the non-volatile storage device using the amount of energy available in the battery.

The determination may be based on operational modes such as a performance mode or a data-safety mode. The operational modes may be specified by parameters or configuration data, for example, the operational mode may be indicative of a level of risk which is deemed permissible when calculating the maximum number of pages of volatile memory to identify as non-volatile.

The determination may also be based on the total number of pages currently identified as non-volatile, or the number of pages that were so identified and that currently have data requiring preservation. The operating system or firmware may determine an amount of energy available per page, and compare that value to the energy required to preserve a page of memory. If the amount is more than sufficient, a greater number of pages may be identified as non-volatile. If the amount is insufficient, the operating system or firmware may take various steps, while on utility power, to re-identify a sufficient number of pages as volatile. The computing system may similarly determine a maximum number of pages of volatile memory that may be identified as non-volatile. The maximum number may be periodically recalculated.

The determination may be based on a calculation of a statistical probability that, in the event of a utility power interruption, the portion of the volatile memory would be transferable to the non-volatile memory using the amount of energy available.

Block 1006 depicts configuring the operating system of a computing device to treat the page of volatile memory as non-volatile memory, based on the determination. Treating the page of volatile memory as non-volatile may include providing, to an application executing on the computing device, information identifying a commit mode that is supported by the memory. The commit mode may, for example, indicate that data written to the memory is immediately committed, i.e. is immediately made durable with respect to the application's involvement (since the operating or firmware will assume responsibility for preserving the contents of memory identified as non-volatile).

Configuring the operating system may comprise updating configuration interface data with information indicating that the page is non-volatile instead of volatile. For example, the firmware may update ACPI tables so that the memory is described to its users as being non-volatile.

Block 1008 depicts receiving information indicative of entering a memory preservation phase. The information may, for example, be sent or otherwise obtained from a battery when utility power has been interrupted. In response to utility power being interrupted, the computing device may switch to using battery power and continue normal operations. However, as time passes, available power in the battery may drop to a point in which the amount of available energy, if it were to further decrease, would not be sufficient to preserve the contents of all volatile memory pages that are currently identified as non-volatile and that have contents to be preserved. At that time, the computing device may enter the memory preservation phase, which may involve shutting down power consumption not needed for memory preservation, and initiating the memory transfers required to preserve the contents of volatile memory identified as non-volatile.

The contents of the page may be transferred in response to receiving information indicative of a reduction in the amount of energy available in the battery. The reduction might, for example, occur because of a loss of utility power, a reduction in the health of the battery, additional devices being connected to the battery, and so forth.

Prior to entering the memory preservation phase, the operating system or firmware of the computing device may begin to decommission pages of volatile memory that had been identified as non-volatile. This may involve preserving the contents of the memory and re-identifying the page as volatile. For example, while on battery power but operating normally, the operating system or firmware may monitor factors such as the time since utility power was interrupted, or the amount of battery power available, and begin to decommission the simulated non-volatile pages under the assumption that the memory preservation phase is becoming increasing likely, but is not yet certain. A tuning parameter or performance parameter may be used to adjust how rapidly this should occur. Where performance rather than safety is at a premium, the parameters may indicate that the system should continue to treat volatile memory as non-volatile for as long as possible.

Block 1010 depicts preserving the contents of the page of memory by transferring the contents of the page to the non-volatile storage device. The contents may, for example, be transferred by a DMA operation as described herein. The computing device may maintain a reserved space on the non-volatile storage device in which the contents of the page may be stored.

Figure 11:
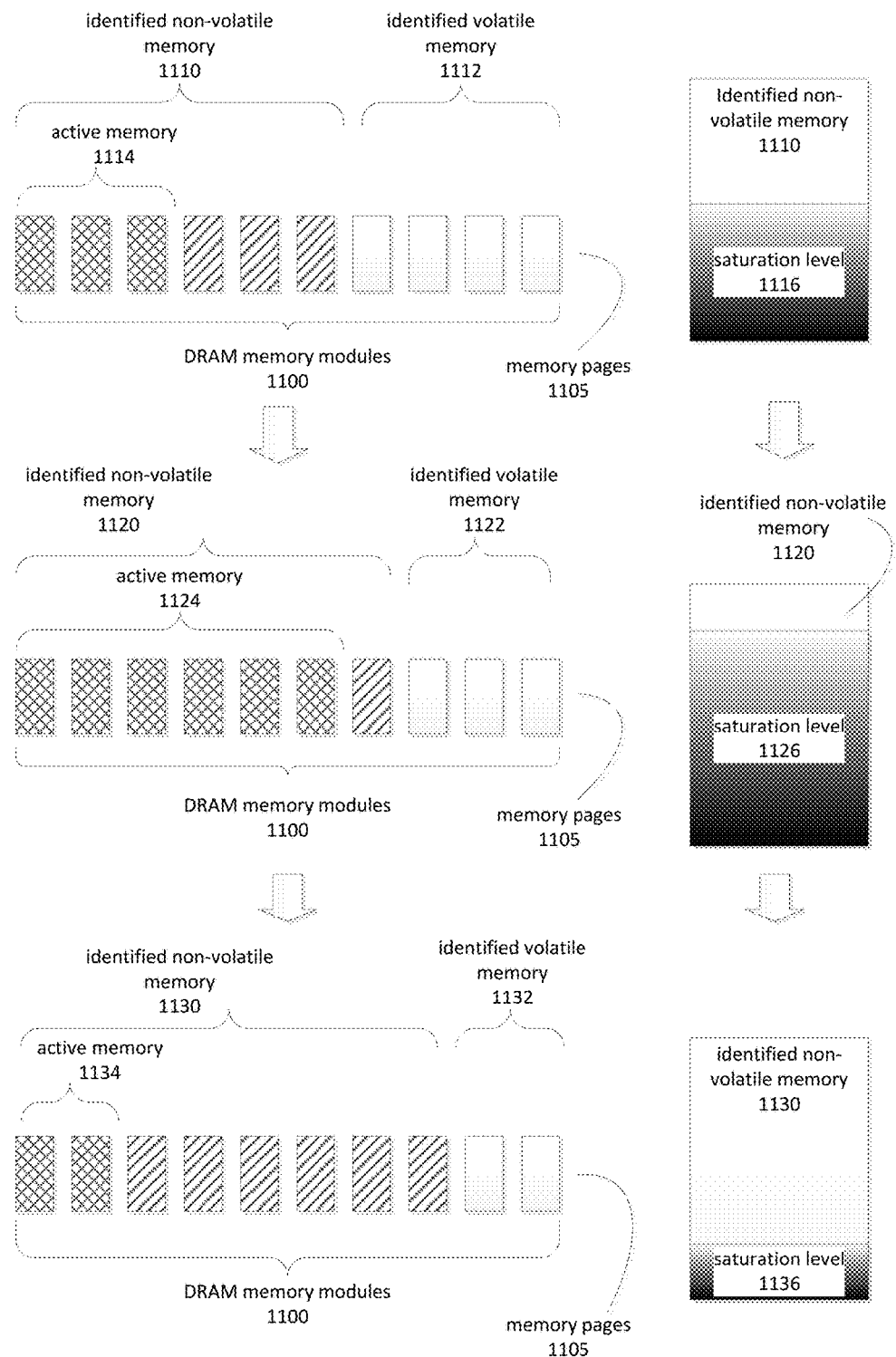
FIG. 11 is a block diagram that depicts adjusting the number of pages identified as non-volatile based on demand for non-volatile memory.

FIG. 11 is a block diagram that depicts adjusting the number of pages identified as non-volatile based on demand for non-volatile storage. FIG. 11 depicts DRAM memory modules 1100 and three provisioning states that may result from fluctuating demand for non-volatile storage by one or more applications executing on a computing device. The example of FIG. 11 is intended to illustrate an embodiment of a computing device, such as the computing device 100 depicted by FIG. 1, which adjusts the amount of memory identified as non-volatile based on demand for non-volatile storage.

In the example of FIG. 11, a demand for non-volatile storage may be determined using an amount of the identified non-volatile memory that is being utilized. The amount of identified non-volatile memory being utilized is referred to herein as "active memory." A relationship between active memory and identified non-volatile memory at a point in time may represent a demand for non-volatile storage at that point in time. The relationship between active memory and memory identified as non-volatile memory is referred to herein as "saturation level." Saturation level may therefore refer to how much of available non-volatile memory (including volatile memory identified as non-volatile memory) this is being used by an application. Saturation level, or other metrics indicative of demand for non-volatile memory, may be measured as of a point in time or over a period of time. In some instances, saturation level may refer to the total amount of memory at a given point in time or over a period of time. In other instances, saturation level may be measured in other ways, for example with reference to the frequency and size of requests to allocation non-volatile memory.

The demand for non-volatile storage might fluctuate for various reasons. For example, an application executing on the computing device 100, such as a virtual machine ("VM"), may be suspended, thereby resulting in a decreased demand for non-volatile storage. As another example, an application may be launched or a VM may be resumed on the computing device 100, thereby resulting in an increased demand for non-volatile storage. In another example, one or more memory regions in DRAM memory modules 1100 may have failed or have been identified as potentially failing. As the memory regions in DRAM memory modules 1100 fail, the number of pages of volatile memory that are available to be identified as non-volatile decreases. This reduced availability of volatile memory may result in a relative increase in demand for non-volatile storage since the memory contents stored in the failed or failing memory regions may need to be relocated.

By monitoring the saturation level over time, an operating system of the computing device with firmware assistance may be able to dynamically adjust the number of pages of volatile memory that are identified as non-volatile. Since DRAM memory modules 1100 may represent a finite resource, any pages identified as non-volatile results in fewer pages of volatile memory being available for other uses. Through dynamically adjusting the identified non-volatile memory, the computing device is able to efficiently provision volatile memory to meet demand for the non-volatile storage while ensuring a sufficient amount of volatile memory is available for other users.

At saturation level 1116, a current amount of active memory 1114 may indicate that a current number of memory pages identified as non-volatile memory 1110 is sufficient to meet demand for non-volatile storage. In FIG. 11, for example, six of the ten depicted memory pages 1105 being identified as non-volatile memory may be sufficient meet the demand while leaving four of the ten depicted memory pages 1105 available for other uses. As such, saturation level 1116 may indicate that identified non-volatile memory 1110 is neither over-provisioned nor under-provisioned at six pages of memory.

At saturation level 1126, a current amount of active memory 1124 may indicate that a current number of memory pages identified as non-volatile memory 1120 is insufficient to meet demand for non-volatile storage. In FIG. 11, for example, seven of the ten depicted memory pages 1105 being identified as non-volatile memory may be insufficient to meet the demand, as measured by saturation level or other metric(s). For example, saturation level 1126 may indicate that identified non-volatile memory 1120 is under-provisioned at seven pages of memory. In an embodiment, the current number of memory pages identified as non-volatile memory 1120 is insufficient when the operating system determines that the saturation level 1126 exceeds a maximum threshold value (e.g., 90% of the pages identified as non-volatile storage).

To address this under-provisioning, the operating system with assistance from the firmware may need to dynamically allocate an additional number of pages for identification as non-volatile memory. By dynamically allocating additional pages identified as non-volatile memory 1120, fewer pages may be identified as volatile memory 1122. As a result, fewer pages of volatile memory 1122 will be available for other uses in the computing device 100. In FIG. 11, for example, eight of the ten depicted memory pages 1105 may be sufficient to meet the demand, thereby leaving two of the ten depicted memory pages 1105 available for other uses. The operating system or firmware might then identify those two pages of the DRAM memory modules 1100 as volatile memory.

At saturation level 1136, a current amount of active memory 1134 may indicate that a current number of memory pages identified as non-volatile memory 1130 is over-sufficient in meeting demand. In FIG. 11, for example, eight of the ten depicted memory pages 1105 being identified as non-volatile memory may be over-sufficient in meeting the demand. As such, saturation level 1136 may indicate that identified non-volatile memory 1130 is over-provisioned at eight pages of memory. In an embodiment, the current number of memory pages identified as non-volatile memory 1120 is over-sufficient when the operating system determines that the saturation level 1136 falls below a minimum threshold value (e.g., 30% of the pages identified as non-volatile storage).

To address this over-provisioning, the operating system with assistance from the firmware may need to dynamically remove a number of pages identified as non-volatile memory 1130. By dynamically removing pages identified as non-volatile memory 1130, more pages may be identified as volatile memory 1132. As a result, more pages of volatile memory 1132 will be available for other uses in the computing device 100. In FIG. 11, for example, four of the ten depicted memory pages 1105 may be sufficient to meet the demand, thereby leaving six of the ten depicted memory pages 1105 available for other uses. The operating system or firmware might then identify those six pages of the DRAM memory modules 1100 as volatile memory.

As discussed above, when a page of memory has been identified as non-volatile memory, its contents may be preserved prior to being subsequently identified as volatile memory. For example, when demand for identified non-volatile memory has decreased, as represented by the transition from saturation level 1126 to saturation level 1136, four pages of identified non-volatile memory 1130 may then transition to being identified as volatile memory. The operating system or firmware may transfer the contents of the four pages of previously identified non-volatile memory 1130 in response determining to transition the pages to be identified as volatile-memory. The contents of the memory may be transferred while applications continue to execute on the computing device 100, and accordingly a memory hand-off procedure may be implemented to ensure that the applications are not affected by the transfers.

In an embodiment, the operating system or firmware may determine to adjust the number of memory pages that may be transferred based on the energy-related factors discussed above. Examples of such energy-related factors include the amount of memory in each page, the amount of energy used to perform a DMA operation, the amount of energy used by devices whose power is maintained during the memory transfer operations, and so forth. For example, when a battery associated with the computing device (e.g., battery 200 of FIG. 2) has a greater amount of energy available, a greater number of pages may be identified as non-volatile memory, and fewer pages may be identified as volatile memory.

At saturation level 1126, an amount of energy available for transferring the contents of memory pages 1105 may also be reduced. There may, for example, be sufficient memory for transferring five memory pages using the available battery power. The operating system or firmware may identify five memory pages as non-volatile memory and five pages identified as volatile memory.

Similarly, at saturation level 1136, the battery may not be able to supply sufficient battery power to transfer the contents of four pages of DRAM memory modules 1100 to a non-volatile storage device. The operating system or firmware might then identify three memory pages as non-volatile memory and seven pages identified as volatile memory. In some instances, the amount of available battery power may fluctuate over time. Thus, it may be the case that a supportable number of pages of volatile memory identified as non-volatile memory must be reduced.

Figure 12:
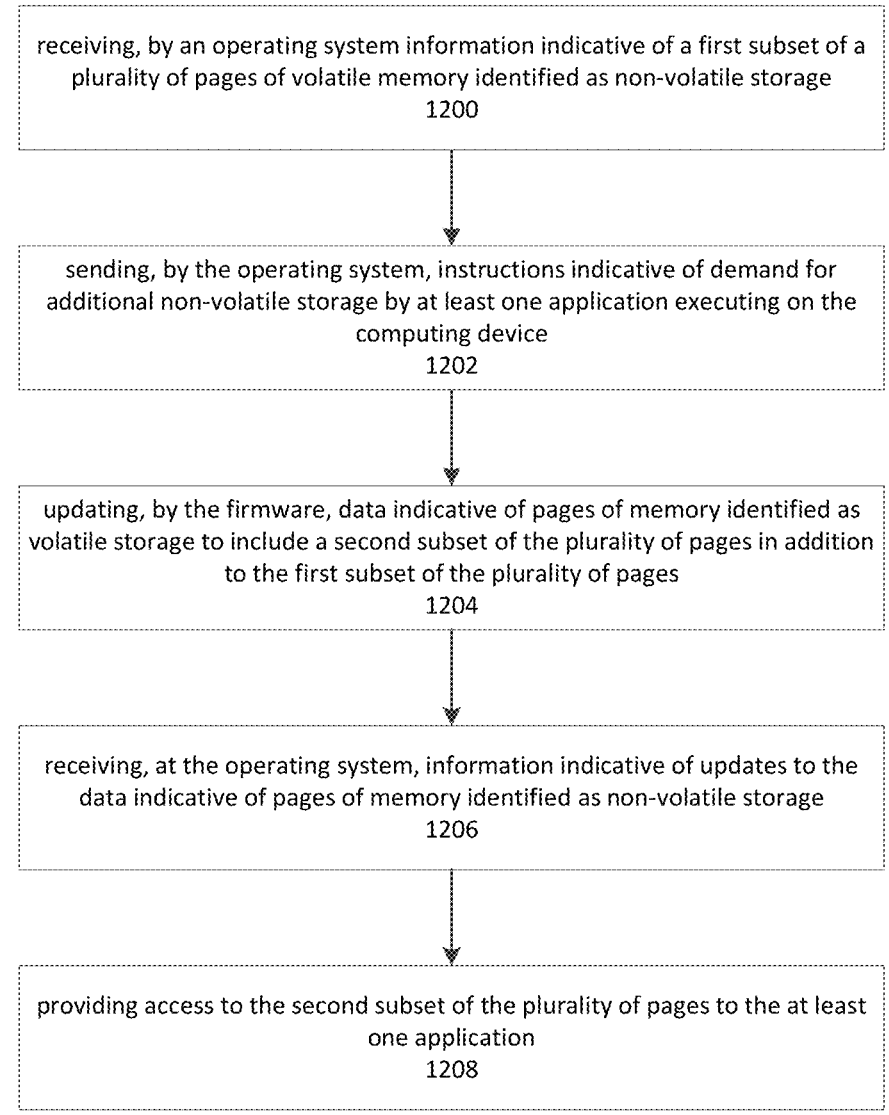
FIG. 12 is a flow diagram depicting an example of a process for adjusting non-volatile memory identification based on an increased demand for non-volatile storage.

FIG. 12 is a flow diagram depicting an example of a process for adjusting non-volatile memory identification based on an increased demand for non-volatile storage. Operations depicted by FIG. 12 may also be applicable to other causes of reducing the amount of memory identified as non-volatile, such as reduced battery power or increased demand for volatile memory. Although depicted as a sequence of blocks, it will be appreciated that the depicted sequence should not be construed as limiting the scope of the present disclosure to embodiments that adhere to the depicted sequence. Moreover, it will be appreciated that, in some embodiments of the present disclosure, certain of the operations indicated by the depicted blocks may be altered, reordered, performed in parallel, or omitted.

Block 1200 depicts an operating system receiving information indicative of a number of volatile memory pages being identified as non-volatile storage by a firmware of the computing device. The firmware of the computing device may identify pages of volatile memory as non-volatile storage using configuration interface data with information indicating that the volatile memory pages are non-volatile instead of volatile. The data indicative of pages of memory identified as non-volatile storage may be a firmware interface table.

Block 1202 depicts the operating system sending instructions to the firmware that indicate a demand for additional non-volatile storage by at least one application executing on the computing device. The demand for additional non-volatile storage may be identified by the operating system using information regarding a saturation level of the pages identified as non-volatile storage. The instructions may, in some instances, be sent to the firmware via a device-specific method ("DSM"). The firmware may, for example, comprise various DSMs which may be invoked by the operating system to communicate demand levels for non-volatile memory, or to explicitly request increased or decreased allocation of non-volatile memory.

For example, the operating system may monitor the saturation level of the identified non-volatile storage. If the monitored saturation level exceeds a predetermined maximum threshold value (e.g., 85% of the identified non-volatile storage), the operation system may determine that additional non-volatile storage is needed. In an embodiment, the instructions to the firmware are sent by the operating system to the firmware via a device-specific method. A background process of the operating system may call the firmware to request the additional non-volatile storage.

Block 1204 depicts the firmware updating data indicative of pages of memory identified as non-volatile storage to include additional volatile memory pages identified as non-volatile storage. Providing additional non-volatile storage may include updating configuration interface data with information indicating that additional volatile memory pages are non-volatile instead of volatile. For example, the firmware may update ACPI tables so that the memory is described to its users as being non-volatile.

The additional volatile memory pages identified as non-volatile storage may be provided by provisioning additional pages of volatile memory, by transferring the contents of a page of volatile memory to a non-volatile storage device, or a combination thereof. The contents may, for example, be transferred by a DMA operation as described herein. The computing device may maintain a reserved space on the non-volatile storage device in which the contents of the page may be stored.

In some instances, information indicative of the demand for non-volatile memory, potentially including but not limited to information describing the amount of volatile memory identified as non-volatile, may be stored in a persistent memory storage (such as a page of actual non-volatile memory) and accessed during a cold-boot of a computing device. For example, information indicating that the second subset of memory was indicated as non-volatile memory may be stored in actual non-volatile memory accessible to the firmware and accessed when the system is rebooting, so that the initial amount of memory identified as non-volatile may be based at least partially on demand for non-volatile memory as measured prior to the reboot.

Block 1206 depicts the operating system receiving information indicative of updates to the data indicative of pages of memory identified as non-volatile storage. The information may be received or otherwise obtained from the firmware upon successfully include the additional non-volatile storage. For example, the firmware may send a firmware interface table notification that informs the operating system that the additional non-volatile storage is available.

In response to receiving the information indicating that additional non-volatile storage is available, drivers associated with a hardware abstraction layer of the operating system may be reinitialized using the updated data. While reinitializing, the drivers may read the updated configuration interface data to determine a size of available non-volatile storage space after identifying additional volatile memory pages as non-volatile. In addition, the drivers may determine whether that non-volatile storage is provided as byte-addressable memory or block-addressable memory by reading the updated configuration interface data.

Block 1208 depicts providing access to the additional pages identified as non-volatile storage to the at least one application. Providing access to the additional pages identified as non-volatile storage may include sending information that exposes the identified non-volatile storage to the application as a byte-addressable or block-addressable storage space.

Figure 13:
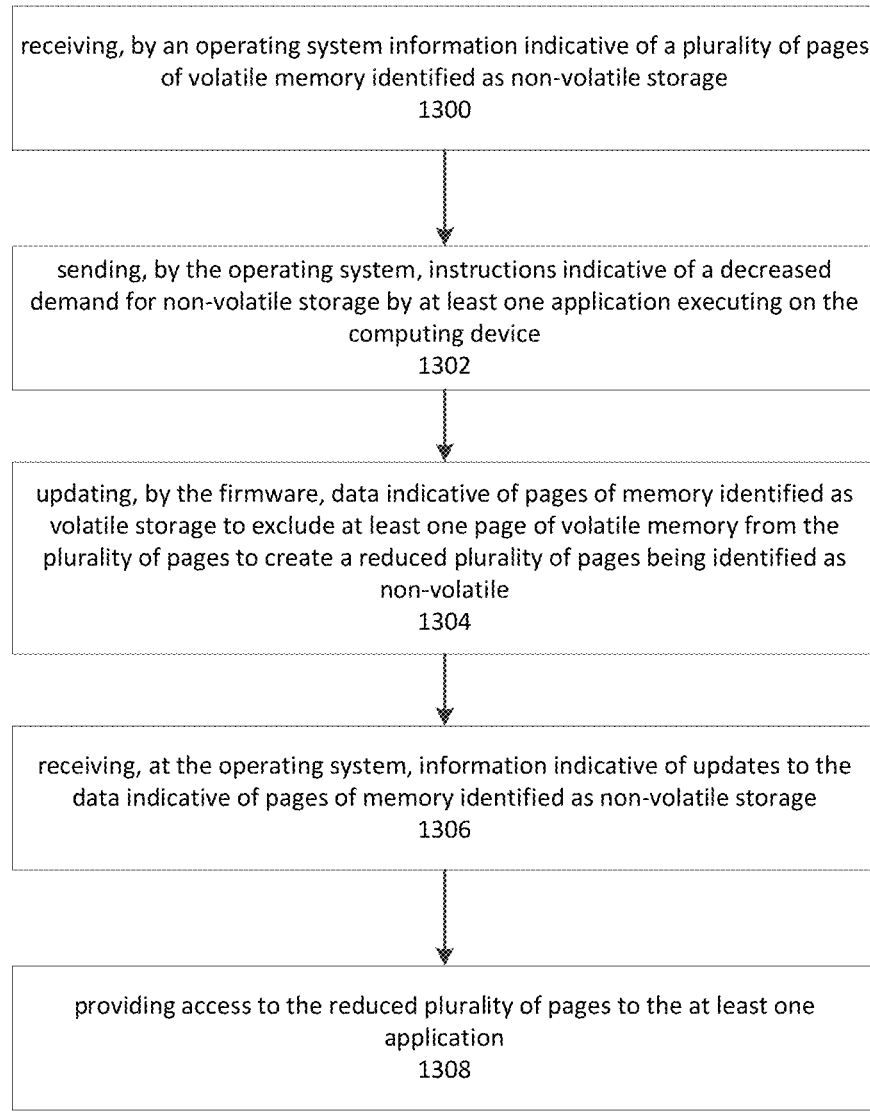
FIG. 13 is a flow diagram depicting an example of a process for adjusting non-volatile memory identification based on a decreased demand for non-volatile storage.

FIG. 13 is a flow diagram depicting an example of a process for adjusting non-volatile memory identification based on a decreased demand for non-volatile storage. Block 1300 depicts a memory manager of an operating system receiving information indicative of a number of volatile memory pages being identified as non-volatile storage by a firmware of the computing device. The memory manager may be a software-based component of the operating system, or a software module independent of the operating system. In some instances, the memory manager may be implemented at least partially in hardware, such as in a memory controller. The memory manager may perform operations such as allocating memory to applications executing on a computing device, reclaiming freed memory, and managing other operations such as paging, swapping, providing virtualization support, and so on.

Block 1302 depicts the memory manager sending instructions to the firmware that indicate a decreased demand for non-volatile storage by at least one application executing on the computing device. The decreased demand for additional non-volatile storage may be identified by the memory manager using information regarding the saturation level of the pages identified as non-volatile storage. For example, the memory manager may monitor the saturation level of the identified non-volatile storage. If the monitored saturation level falls below a predetermined minimum threshold value (e.g., 35% of the identified non-volatile storage), the memory manager may determine that a reduction of non-volatile storage is needed.

Prior to instructing the firmware to reduce the number of volatile memory pages identified as non-volatile, the memory manager may instruct the application to release a portion of the identified non-volatile storage. For example, a handoff operation may occur between application and the operating system to ensure that the application is not using the portion of the identified non-volatile storage being reduced. As a result, the memory manager is able to free up the portion of identified non-volatile storage for reduction. In some instances, the operating system may determine to identify a page of memory previously identified as non-volatile as volatile. The memory manager may also cause the contents of memory to be transferred to another page of memory, such as a page of memory still identified as non-volatile, or to a storage device. In some cases, this operation may comprise sending a notification to an affected application that memory previously treated as non-volatile is to be instead treated as volatile.

Block 1304 depicts the firmware updating data indicative of pages of memory identified as non-volatile storage to exclude at least one page of volatile memory from the volatile memory pages identified as non-volatile storage. For example, the firmware may update ACPI tables so that a portion of the memory that was previously described to its users as non-volatile is identified as volatile. As discussed above, reducing the amount of volatile memory identified as non-volatile storage increases the amount of volatile memory that is available for other uses.

In some instances, the firmware may provide information that may be used in relation to the operations performed by memory modules during shutdown. For example, the firmware could provide information indicating which memory modules have been configured to act as non-volatile storage. This information may be used, in some instances, to configure a memory module. For example, a hybrid memory module comprising a volatile portion and a built-in non-volatile portion may be configured to persist the contents of the volatile portion, to the non-volatile portion, when the memory module is configured to act as non-volatile storage. When configured as volatile storage, the hybrid memory module may skip operations related to preserving the contents of its volatile memory portion.

The information may also be used by a systems management interrupt handle ("SMI") to determine which memory regions should be persisted during shutdown, in order to preserve the contents of volatile memory that has been identified as non-volatile. Upon shutdown, the contents of memory that is currently identified as non-volatile may be preserved. In some instances, the information may also include data indicating whether a memory page is in a transitional state, such that it is no longer identified as non-volatile but has contents that should be preserved, due to being previously identified as non-volatile.

Block 1306 depicts the memory manager receiving information indicative of updates to the data indicative of pages of memory identified as non-volatile storage. The information may be received or otherwise obtained from the firmware upon successfully excluding one or more pages of volatile memory from the identified non-volatile storage. For example, the firmware may send a firmware interface table notification that informs the operating system that the reduced non-volatile storage is available.

In response to receiving the information indicating that the reduced non-volatile storage is available, drivers associated with a hardware abstraction layer of the operating system may be reinitialized using the updated data. While reinitializing, the drivers may read the updated configuration interface data to determine a size of available non-volatile storage space after identifying additional volatile memory pages as non-volatile. In addition, the drivers may determine whether that non-volatile storage is provided as byte-addressable memory or block-addressable memory by reading the updated configuration interface data.

Block 1308 depicts providing the at least one application with access to the reduced non-volatile storage. Providing access to the additional pages identified as non-volatile storage may include sending information to the application that identifies a commit mode that is supported by the memory, as described herein.

Figure 14:
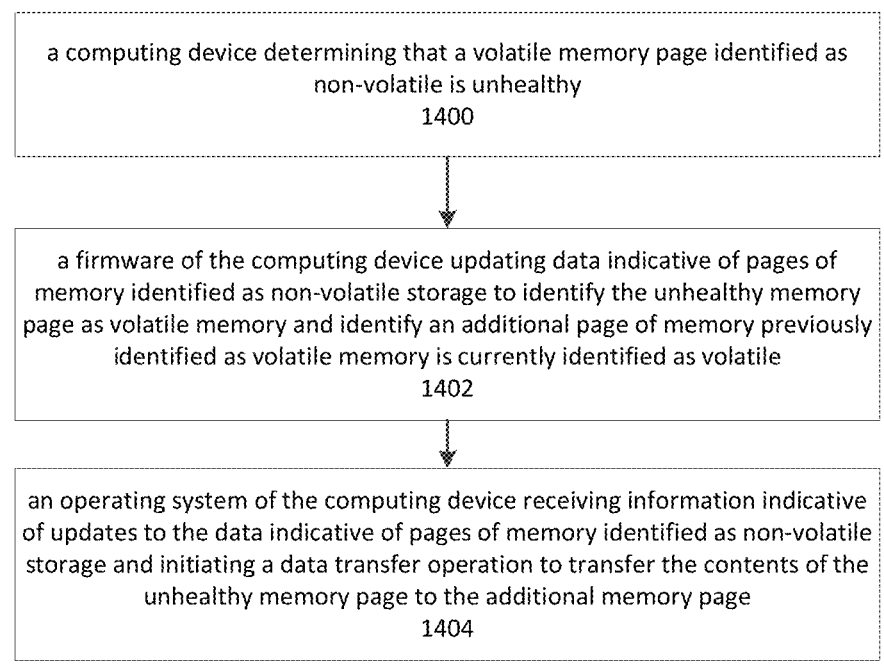
FIG. 14 is a flow diagram depicting an example of a process for adjusting non-volatile memory identification to autonomously heal a computing device by detecting and addressing potential memory faults.

FIG. 14 is a flow diagram depicting an example of a process for adjusting non-volatile memory identification to autonomously heal a computing device by detecting and addressing potential memory faults. The example process depicted in FIG. 14 may improve the reliability availability and serviceability capabilities of the computing device.

Block 1400 depicts a computing device determining that a volatile memory page identified as non-volatile is unhealthy. The volatile memory page may be identified as unhealthy using a variety of methods, such as a leaky-bucket algorithm to measure a rate of errors in the memory. In some instances, a fault event trigger may be executed when a number of memory-fault errors in a specific time window exceed a pre-configured threshold.

Block 1402 depicts a firmware of the computing device updating data indicative of pages of memory identified as non-volatile storage to identify the unhealthy memory page as volatile memory. The firmware may further update the identified non-volatile storage to include an additional page of memory previously identified as volatile memory is currently identified as volatile.

Block 1404 depicts an operating system of the computing device receiving information indicative of updates to the data indicative of pages of memory identified as non-volatile storage. The operating system may reinitialize the drivers associated with a hardware abstraction layer using the updated data, as described above. In addition, the operating system may initiate a data transfer operation to transfer the contents of the unhealthy memory page to the additional memory page that replaces it using the techniques described herein.

In some instances, an operating system may receive a hardware fault message that indicates that a page of memory has encountered a error or is otherwise believed to be faulty. The operating system may, for example, receive notification of a "machine check" event, or may process this or other such information maintained in a log file. When the faulty memory has been identified as non-volatile, the operating system may respond by requesting the provision of a substitute page of memory that may be treated as non-volatile. The operating system may further cause references to the faulty page of memory to be remapped to the substitute page. The operating system might also defer to skip such action when the faulty memory is in active use. Alternatively, in some instances the operating system might permit a crash to occur, rather than performing the substitution.

Figure 15:
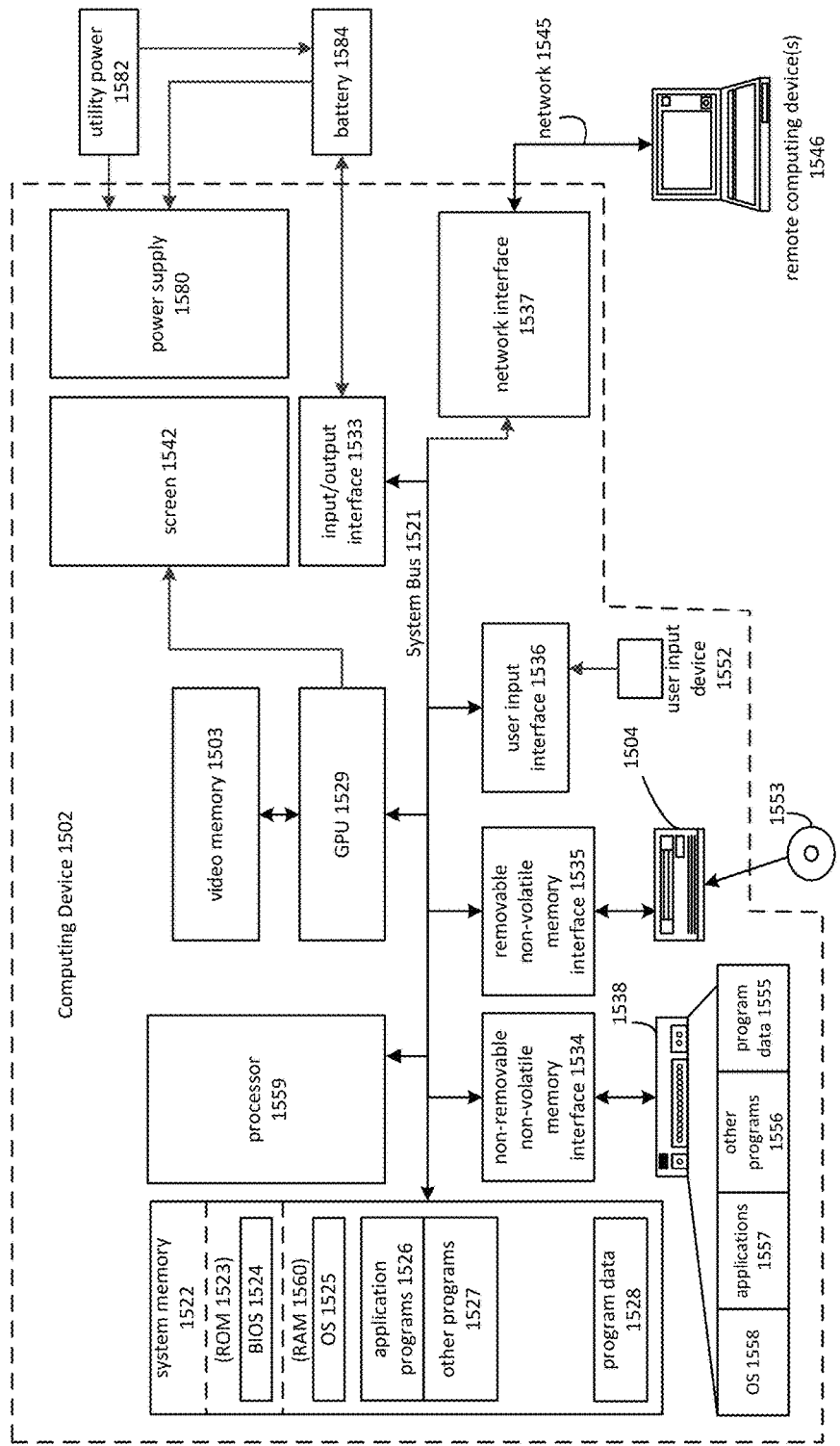
FIG. 15 depicts an example general purpose computing environment in which in which the techniques described herein may be embodied.

Aspects of the present disclosure may be implemented on one or more computing devices or environments. FIG. 15 depicts an example computing environment in which in which some of the techniques described herein may be embodied. The computing device 1502 is only one example of a suitable computing environment and is not intended to suggest any limitation as to the scope of use or functionality of the presently disclosed subject matter. Neither should the depiction of the computing environment be interpreted as implying any dependency or requirement relating to any one or combination of components illustrated in the example computing device 1502. In some embodiments the various depicted computing elements may include circuitry configured to instantiate specific aspects of the present disclosure. For example, the term circuitry used in the disclosure can include specialized hardware components configured to perform function(s) by firmware or switches. In other examples embodiments the term circuitry can include a general purpose processing unit, memory, etc., configured by software instructions that embody logic operable to perform function(s). In example embodiments where circuitry includes a combination of hardware and software, an implementer may write source code embodying logic and the source code can be compiled into machine readable code that can be processed by the general purpose processing unit. Since one skilled in the art can appreciate that the state of the art has evolved to a point where there is little difference between hardware, software, or a combination of hardware/software, the selection of hardware versus software to effectuate specific functions is a design choice left to an implementer. More specifically, one of skill in the art can appreciate that a software process can be transformed into an equivalent hardware structure, and a hardware structure can itself be transformed into an equivalent software process. Thus, the selection of a hardware implementation versus a software implementation is one of design choice and left to the implementer.

Computing device 1502, which may include any of a mobile device, smart phone, tablet, laptop, desktop computer, etc., typically includes a variety of computer-readable media. Computer-readable media can be any available media that can be accessed by computing device 1502 and includes both volatile and nonvolatile media, removable and non-removable media. As used herein, media and computer readable media do not include propagating or transitory signals per se.

The system memory 1522 includes computer-readable storage media in the form of memory such as read only memory ("ROM") 1523 and random access memory ("RAM") 1560. The RAM memory 1560 may include volatile memory modules, such as dual in-line memory modules ("DIMMs"). The RAM 1560 portion of system memory 1522 may sometimes be referred to as main memory. RAM 1560 typically contains data and/or program modules that are immediately accessible to and/or presently being operated on by processor 1559. By way of example, and not limitation, FIG. 15 illustrates operating system 1525, application programs 1526, other program modules 1527, and program data 1528.

The processor 1559 typically contains at least one primary processing unit, sometimes referred to as a core, and at least one system agent, sometimes referred to as an uncore. The core of the processor 1559 typically executes computer-executable instructions while the uncore performs related tasks which may include overseeing memory transfers and maintaining a processor cache. The uncore may comprise a memory controller for interfacing between cores of the processor 1559 and system memory 1522.

A basic input/output system 1524 ("BIOS"), containing the basic routines that help to transfer information between elements within computing device 1502, such as during start-up, is typically stored in ROM 1523. The BIOS 1524 may be replaced, in various embodiments, by other firmware.

The computing device 1502 may also include non-volatile storage devices. By way of example only, FIG. 15 illustrates a hard disk drive 1538 that reads from or writes to non-removable, non-volatile magnetic media, and an optical disk drive 1514 that reads from or writes to a removable, non-volatile optical disk 1553 such as a CD ROM or other optical media. Other non-volatile storage devices that can be used in the example operating environment include, but are not limited to, flash memory, digital versatile disks, solid state disk drives, and the like. The hard disk drive 1538 is typically connected to the system bus 1521 through an non-removable memory interface such as interface 1534, and optical disk drive 1504 is typically connected to the system bus 1521 by a removable memory interface, such as interface 1535.

The drives and their associated computer storage media discussed above and illustrated in FIG. 15, provide storage of computer-readable instructions, data structures, program modules and other data for the computing device 1502. In FIG. 15, for example, hard disk drive 1538 is illustrated as storing instructions of the operating system 1158, application programs 1557, other program modules 1556, and program data 1555. Note that these components can either be the same as or different from operating system 1525, application programs 1526, other program modules 1527, and program data 1528. Operating system 1558, application programs 1557, other program modules 1556, and program data 1555 are given different numbers here to illustrate that, at a minimum, they are different copies. A user may enter commands and information into the computing device 1502 through a user input device 1552. The user interface device 1552 may include, but is not limited to, keyboards, touchpads, computer mice, trackballs, and so forth. Other input devices, also not shown, may include a microphone, joystick, game pad, satellite dish, scanner, or the like. These and other input devices are often connected to the processing unit 1559 through a user input interface 1536 that is coupled to the system bus, but may be connected by other interface and bus structures, such as a parallel port, game port or a universal serial bus (USB). A screen 1542 or other type of display device is also connected via GPU 1529, although in some instances the screen 1542 may be driven through the system bus 1521 or another interface. In addition to the monitor, computers may also include other peripheral input/output devices such as speakers, printers, and so forth which may be connected through an input/output interface 1533. A battery 1584 may also be connected to the system by the input/output interface 1533. The battery 1584 may send and receive information via the input/output interface 1533. The information may include state information such as the amount of energy available in the battery 1534, the state of utility power 1582, the health of the battery 1534, and so forth.

A power supply 1580 may control delivery of power to the components of computing device 1502. Power delivery may, at times, be suspended to particular components while maintained to other components. Suspension of power may involve total or partial interruption in the flow of energy to an effective component, and may therefore include causing a component to enter a low-power state.

The power supply 1580 may receive power from utility power 1582 or a battery 1584. Utility power 1582 may refer to any power source that may be considered to be generally available during an operational period of the computing device 1502. The battery 1584 may include any power source intended to provide backup power in the event that utility power 1182 is interrupted.

The computing device 1502 may operate in a networked environment using logical connections to one or more remote computers, such as a remote computer 1546. The remote computer 1546 may be a personal computer, a server, a router, a network PC, a peer device or other compute node, and typically includes many or all of the elements described above relative to the computing device 1502. The connections depicted in FIG. 15 include a network 1545, which may include local-area, wide-area, cellular, and mesh networks, or other types of networks.

It will also be appreciated that various items are illustrated as being stored in memory or on storage while being used, and that these items or portions thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a computer-readable medium, such as a hard disk, a memory, a network or a portable media article to be read by an appropriate drive or via an appropriate connection. The systems, modules and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present disclosure may be practiced with other computer system configurations.

Each of the processes, methods and algorithms described herein may be embodied in, and fully or partially automated by, modules comprising computer executable instructions loaded into memory and executed by one or more processors of a computing device. The processes and algorithms may also be implemented wholly or partially in application-specific circuitry. The results of the disclosed processes and process steps may be stored, persistently or otherwise, in any type of computer storage device such as, e.g., volatile or non-volatile storage. Volatile and non-volatile storage, as used herein, excludes propagating or transitory signals per se.

The various features and processes described herein may be used independently of one another, or may be combined in various ways. All possible combinations and subcombinations are intended to fall within the scope of this disclosure. In addition, certain elements of the processes, methods, and algorithms may be omitted in some implementations. The methods and processes described herein are also not limited to any particular sequence, and the depictions comprising blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel or in some other manner. Blocks or states may be added to or removed from the disclosed example embodiments. The example systems and components described herein may be configured differently than described. For example, elements may be added to, removed from or rearranged compared to the disclosed example embodiments.

Conditional language used herein, such as, among others, "can," "could," "might," "may," "e.g." and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having" and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some or all of the elements in the list.

The embodiments presented herein are so presented by way of example, and are not intended to limit the scope of the present disclosure. Thus, nothing in the foregoing description is intended to imply that any particular feature, characteristic, step, module or block is required, necessary, or indispensable. The methods and systems described herein may be embodied in a variety of forms. Various omissions, substitutions and changes in the form of the methods and systems described herein may be made without departing from the spirit of what is disclosed herein. The accompanying claims and their equivalents are intended to cover such forms or modifications as would fall within the scope and spirit of certain embodiments disclosed herein.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims

What is claimed:

1. A computing device comprising:
one or more volatile memories logically partitioned into a plurality of pages;
a firmware of the computing device;
one or more processors that cause the computing device to at least:
provide, by the firmware, information indicative of a first subset of the plurality of pages of volatile memory, the first subset comprising one or more pages of volatile memory identified by the firmware as non-volatile storage;
receive, by the firmware, an indication of demand for additional non-volatile storage on the computing device;
update, by the firmware and based at least in part on the received indication, data indicative of pages of memory identified as non-volatile storage to include a second subset of the plurality of pages in addition to the first subset of the plurality of pages; and
provide, by the firmware, information indicative of updates to the data indicative of pages of memory identified as non-volatile storage.

2. The computing device of claim 1, wherein the one or more processors further cause the computing device to at least:
store, in a non-volatile memory, information indicative of the second subset of the plurality of pages being identified as non-volatile storage; and
determine, upon a cold-boot of the computing device, the second subset of the plurality of pages as non-volatile based at least in part on the stored information.

3. The computing device of claim 1, wherein the one or more processors further cause the computing device to at least:
receive, by the firmware, information indicative of decreased demand for non-volatile storage; and
provide, by the firmware, information indicative of pages of memory previously identified as non-volatile memory being identified as volatile.

4. The computing device of claim 1, wherein the one or more processors further cause the computing device to at least:
receive information indicating that a first page of the first subset of the plurality of pages is unhealthy;
update the data indicative of pages of memory identified as non-volatile storage to identify the first page as volatile memory and to identify a second page of the plurality of pages as non-volatile storage; and
cause the second page to be used in place of the first page.

5. The computing device of claim 1, wherein the one or more processors further cause the computing device to at least:
determine, by the firmware, to identify a page of the first subset of the plurality of pages as volatile memory based at least in part on determining that an amount of available battery power has been reduced.

6. The computing device of claim 1, wherein the data indicative of pages of memory identified as non-volatile storage is a firmware interface table.

7. The computing device of claim 1, wherein the indication of demand is provided to the firmware via a device-specific method.

8. The computing device of claim 1, wherein the one or more processors further cause the computing device to at least::
determine, by the firmware, to identify a page of the first subset of the plurality of pages as volatile memory based at least in part on determining that a length of time has lapsed since the computer switched from utility power to battery power.

9. The computing device of claim 1, wherein the data indicative of pages of memory identified as non-volatile storage comprises information indicative of storing contents of the pages of memory to a non-volatile storage device during shutdown.

10. A method of using memory of a computing device, the method comprising:
receiving, by a memory manager of the computing device, information indicative of a plurality of pages of volatile memory identified as non-volatile storage;
sending, by the memory manager, one or more instructions indicative of a decreased demand for non-volatile storage by at least one application executing on the computing device;
receiving, by the memory manager after sending the one or more instructions, information indicative of changes to the information indicative of the plurality of pages of volatile memory identified as non-volatile storage;
receiving, by the memory manager after sending the one or more instructions, updated information indicative of pages of memory identified as non-volatile storage, the updated information excluding at least one page of volatile memory previously identified as non-volatile storage in the information to indicate a reduced plurality of pages being identified as non-volatile storage; and
providing access to the reduced plurality of pages to the at least one application.

11. The method of claim 10, wherein the memory manager instructs the at least one application to release the at least one page of memory prior to sending the one or more instructions.

12. The method of claim 10, further comprising:
reinitializing drivers associated with a hardware abstraction layer using the updated data indicative of pages of memory identified as non-volatile storage.

13. The method of claim 10, further comprising:
storing, in a non-volatile memory, information indicative of the reduced plurality of pages being identified as non-volatile storage; and
determining, upon a cold-boot of the computing device, to identify the reduced plurality of pages as non-volatile based at least in part on the stored information.

14. The method of claim 10, further comprising:
receiving information indicative of a second at least one page of volatile memory previously identified as non-volatile storage being identified as volatile, in response to the second at least one page of volatile memory being associated with a memory error.

15. One or more computer-readable hardware storage device having stored computer-executable instructions that are executable by one or more processors of a computing device to cause the computing device to at least:

receive information indicative of one or more of a plurality of pages of volatile memory identified as non-volatile storage;

send one or more instructions to change an amount of non-volatile storage;

receive, after sending the one or more instructions, information indicative of updates to data indicative of pages of memory identified as non-volatile storage, wherein the updates comprise at least one of addition of a page of volatile memory to the plurality of pages identified as non-volatile storage, or removal of a page of volatile memory from the plurality of pages identified as non-volatile storage; and provide access to the plurality of pages to at least one application executing on the computing device.

16. The one or more computer-readable hardware storage device of claim 15, comprising further instructions that, upon execution by the computing device, cause the computing device to at least:

update the information indicative of the one or more pages of volatile memory identified as non-volatile storage to identify a page of the plurality of pages as block-addressable memory.

17. The one or more computer-readable hardware storage device of claim 15, comprising further instructions that, upon execution by the computing device, cause the computing device to at least:

in response to receiving the information indicative of the updated data, reinitialize drivers associated with a hardware abstraction layer using the updated data indicative of pages of memory identified as non-volatile storage.

18. The one or more computer-readable hardware storage device of claim 15, comprising further instructions that, upon execution by the computing device, cause the computing device to at least:

identify at least one page of the plurality of pages, previously identified as non-volatile, as volatile; and transfer contents of the at least one page to non-volatile memory.

19. The one or more computer-readable hardware storage device of claim 15, wherein the one or more instructions are sent to firmware via a device-specific method.

20. The one or more computer-readable hardware storage device of claim 15, comprising further instructions that, upon execution by the computing device, cause the computing device to at least:

reinitialize drivers associated with a hardware abstraction layer using the updated data indicative of pages of memory identified as non-volatile storage.

* * * * *